(12) United States Patent
Majani et al.

(10) Patent No.: US 6,523,051 B1
(45) Date of Patent: Feb. 18, 2003

(54) DIGITAL SIGNAL TRANSFORMATION DEVICE AND METHOD

(75) Inventors: Eric Majani, Rennes (FR); Patrice Onno, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/333,036

(22) Filed: Jun. 15, 1999

(30) Foreign Application Priority Data

Jul. 9, 1998 (FR) .......................................... 98 08824

(51) Int. Cl.[7] .......................... G06F 17/10; G06F 17/14
(52) U.S. Cl. ........................ 708/300; 708/308; 708/400
(58) Field of Search .................. 708/400–401, 708/403–409, 300, 308, 319

(56) References Cited

U.S. PATENT DOCUMENTS

| | | | | |
|---|---|---|---|---|
| 4,709,343 A | * | 11/1987 | Van Cong | 708/319 |
| 5,805,485 A | * | 9/1998 | Ito et al. | 708/406 |
| 5,808,925 A | * | 9/1998 | Ito et al. | 708/406 |

FOREIGN PATENT DOCUMENTS

EP 0744701 A 11/1996 ........... G06F/17/14

OTHER PUBLICATIONS

"Fast Algorithms For Discrete and Continuous Wavelet Transforms", IEEE Transactions on Information Theory 38 Mar. (1992) No. 2, Pt.II, NY, USA pp. 569–586.

"Parallel pipeline implementation of wavelet transforms", IEE Proceedings; Vision, Image and Signal Processing, vol. 144, No. 6, Dec., 1997 pp. 355–359.

"Design of Prefilters for Discrete Multiwavelet Transforms", IEE Transactions on Signal Processing, vol. 44, No. 1, Jan. 1, 1996, pp. 25–35.

"The Lifting Scheme: A Custom–Design Construction of Biorthogonal Wavelets", Applied and Computational Harmonic Analysis, vol. 3. No. 2, Apr. 2, 1996, pp. 186–200.

* cited by examiner

*Primary Examiner*—Tan V. Mai
(74) *Attorney, Agent, or Firm*—Fitzpatrick, Cella, Harper & Scinto

(57) ABSTRACT

A digital signal transformation method, in which the original samples ($x_{2i}$; $y^1_{2i}$) of the digital signal are transformed into output samples ($y^1_{2i}$, $x_{2i}$). Any output sample being calculated by a function of original samples, and/or of intermediate samples ($t_{2i+1}$, $v_{2i}$, $t^1_{2i}$, $v^1_{2i+1}$), and/or of output samples is characterized in that each function is broken down into elementary operations, and the elementary operations of all the functions are ordered so as to minimize the number of samples that are simultaneously necessary. The invention makes it possible to minimize the memory space necessary to calculate the transformation.

16 Claims, 28 Drawing Sheets

Table 1 (Operations 1–12)

Figure 1:
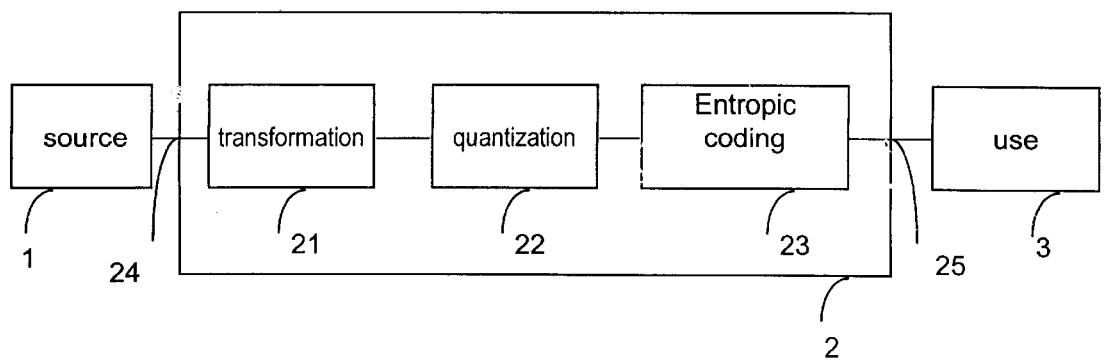

| | | | | | | _2_ | _3_ | _4_ | _5_ | _6_ | |
|---|---|---|---|---|---|---|---|---|---|---|---|
| IN | | 0,1 | | | | 0,2,3,4 | 0,2,3,4 | 0,2,3,4,5 | 0,2,3,4,5 | 0,2,4,5,6 | 0,2,4,5,6 |
| Buffer | 0,1 | 0,1,2 | 0,1,2 | 0,1,2,3 | 0,2,3,4 | 0,2,3,4 | 0,2,3,4,5 | 0,2,3,4,5 | 0,2,4,5,6 | 0,2,4,5,6 | 0,2,4,5,6 | 0,2,4,5,6 |
| OP | 1 | 2 | 3 | 4 | 5 | 6 | 7 | 8 | 9 | 10 | 11 | 12 |
| OUT | | | | 1 | | | | 3 | | | 6 | 12 |

Table 2 (Operations 13–24)

| | | | | _7_ | _8_ | _9_ | _10_ | | | | | |
|---|---|---|---|---|---|---|---|---|---|---|---|---|
| IN | | | | | | | | | | | | |
| Buffer | 0,2,4,5,6 | 0,2,4,5,6 | 2,4,5,6,7 | 2,4,5,6,7 | 2,4,6,7,8 | 2,4,6,7,8 | 2,4,6,7,8 | 2,4,6,7,8 | 4,6,7,8,9 | 4,6,7,8,9 | 4,6,8,9,10 | 4,6,8,9,10 |
| OP | 13 | 14 | 15 | 16 | 17 | 18 | 19 | 20 | 21 | 22 | 23 | 24 |
| OUT | | 0 | | 5 | | | | 2 | | 7 | | 24 |

Table 3 (Operations 25–36)

| | | | _11_ | _12_ | | _13_ | _14_ | | | | | |
|---|---|---|---|---|---|---|---|---|---|---|---|---|
| IN | | | | | | | | | | | | |
| Buffer | 4,6,8,9,10 | 4,6,8,9,10 | 6,8,9,10,11 | 6,8,9,10,11 | 6,8,10,11,12 | 6,8,10,11,12 | 6,8,10,11,12 | 6,8,10,11,12 | 8,10,11,12,13 | 8,10,11,12,13 | 8,10,12,13,14 | 8,10,12,13,14 |
| OP | 25 | 26 | 27 | 28 | 29 | 30 | 31 | 32 | 33 | 34 | 35 | 36 |
| OUT | | 4 | | 9 | | | | 6 | | 11 | | 36 |

Table 4 (Operations 37–48)

| | | _15_ | _16_ | | | | | | | | | |
|---|---|---|---|---|---|---|---|---|---|---|---|---|
| IN | | | | | | | | | | | | |
| Buffer | 8,10,12,13,14 | 8,10,12,13,14 | 10,12,13,14,15 | 10,12,13,14,15 | 10,12,14,15,16 | 10,12,14,15,16 | 10,12,14,15,16 | 10,12,14,15,16 | 12,14,15,16 | 12,14,16 | 12,14,16 | 14,16 |
| OP | 37 | 38 | 39 | 40 | 41 | 42 | 43 | 44 | 45 | 46 | 47 | 48 |
| OUT | | 8 | 13 | | | 10 | | | 15 | 12 | | 14,16 |

*fig. 8* figure 10

| IN     |      |       | 4     |       | 1       | 6         |           |           |           | 3         | 8         |           |
|--------|------|-------|-------|-------|---------|-----------|-----------|-----------|-----------|-----------|-----------|-----------|
| Buffer | 0,2  | 0,2   | 0,2,4 | 0,2,4 | 0,1,2,4 | 0,1,2,4,6 | 0,1,2,4,6 | 0,1,2,4,6 | 0,1,2,4,6 | 1,2,3,4,6 | 2,3,4,6,8 | 2,3,4,6,8 |
| OP     | 1    | 2     | 3     | 4     | 5       | 6         | 7         | 8         | 9         | 10        | 11        | 12        |
| OUT    |      |       |       |       |         |           | 0         |           | 1         |           |           | 2,3,4,6,8 |

| IN     |         |       | 5       |         |         | 10        |           |           |           | 7         | 12        |           |
|--------|---------|-------|---------|---------|---------|-----------|-----------|-----------|-----------|-----------|-----------|-----------|
| Buffer | 2,3,4,6,8 | 2,3,4,6,8 | 3,4,5,6,8 | 3,4,5,6,8 | 4,5,6,8,10 | 4,5,6,8,10 | 4,5,6,8,10 | 4,5,6,8,10 | 5,6,7,8,10 | 5,6,7,8,10 | 6,7,8,10,12 | 6,7,8,10,12 |
| OP     | 13      | 14    | 15      | 16      | 17      | 18        | 19        | 20        | 21        | 22        | 23        | 24        |
| OUT    |         | 2     |         | 3       |         |           | 4         |           | 5         |           |           |           |

| IN     |             |             | 9         |             |             | 14          |             |             |             | 11          | 16            |               |
|--------|-------------|-------------|-----------|-------------|-------------|-------------|-------------|-------------|-------------|-------------|---------------|---------------|
| Buffer | 6,7,8,10,12 | 6,7,8,10,12 | 7,8,9,10,12 | 7,8,9,10,12 | 8,9,10,12,14 | 8,9,10,12,14 | 8,9,10,12,14 | 8,9,10,12,14 | 9,10,11,12,14 | 9,10,11,12,14 | 10,11,12,14,16 | 10,11,12,14,16 |
| OP     | 25          | 26          | 27        | 28          | 29          | 30          | 31          | 32          | 33          | 34          | 35            | 36            |
| OUT    |             | 6           |           | 7           |             |             | 8           |             | 9           |             |               |               |

| IN     |               |               | 13          |             |             |             | 15          |             |             |             | 14          |       |
|--------|---------------|---------------|-------------|-------------|-------------|-------------|-------------|-------------|-------------|-------------|-------------|-------|
| Buffer | 10,11,12,14,16 | 10,11,12,14,16 | 11,12,13,14,16 | 11,12,13,14,16 | 12,13,14,16 | 12,13,14,16 | 13,14,15,16 | 13,14,15,16 | 13,14,15,16 | 14,15,16    | 14,15,16    | 15,16 |
| OP     | 37            | 38            | 39          | 40          | 41          | 42          | 43          | 44          | 45          | 46          | 47          | 48    |
| OUT    |               | 10            |             | 11          |             | 12          |             |             | 13          |             | 14          | 15,16 |

| IN | 0,1 | 2 | 3 | | | 4 | | | | 5 | |
|---|---|---|---|---|---|---|---|---|---|---|---|
| Buffer | 0,1 | 0,1,2 | 0,1,2,3 | 0,1,2,3 | 0,1,2,3 | 0,1,2,3,4 | 0,1,2,3,4 | 0,1,2,3,4 | 0,1,2,3,4 | 0,1,2,3,4,5 | |
| OP | 1 | 2 | 4 | 5 | 6 | 7 | 8 | 9 | 10 | 11 | 12 |
| OUT | | | | | | | | | | | |
| IN | | | | | 6 | 7 | | | | | 8 |
| Buffer | 0,1,2,3,4,5 | 0,2,3,4,5 | 0,2,3,4,5,6 | 0,2,3,4,5,6 | 0,2,3,4,5,6 | 0,2,3,4,5,6,7 | 0,2,3,4,5,6,7 | 0,2,3,4,5,6,7 | 0,2,3,4,5,6,7 | 0,2,3,4,5,6,7 | 0,2,4,5,6,7,8 |
| OP | 13 | 14 | 15 | 16 | 17 | 18 | 19 | 20 | 21 | 22 | 23 | 24 |
| OUT | | 1 | | | | | | | | 3 | |
| IN | | | | | 9 | | | 10 | | | |
| Buffer | 0,2,4,5,6,7,8 | 0,2,4,5,6,7,8 | 0,2,4,5,6,7,8 | 0,2,4,5,6,7,8 | 0,2,4,5,6,7,8,9 | 0,2,4,5,6,7,8,9 | 0,2,4,5,6,7,8,9 | 0,2,4,6,7,8,9,10 | 0,2,4,6,7,8,9,10 | 0,2,4,6,7,8,9,10 | 0,2,4,6,7,8,9,10 |
| OP | 25 | 26 | 27 | 28 | 29 | 30 | 31 | 32 | 33 | 34 | 35 | 36 |
| OUT | | | | | | | | | 5 | | | |
| IN | | | | 11 | | 12 | | | | | |
| Buffer | 0,2,4,6,7,8,9,10 | 0,2,4,6,7,8,9,10 | 0,2,4,6,7,8,9,10 | 0,2,4,6,7,8,9,10,11 | 0,2,4,6,7,8,9,10,11 | 0,2,4,6,8,9,10,11 | 0,2,4,6,8,9,10,11 | 0,2,4,6,8,9,10,11 | 0,2,4,6,8,9,10,11,12 | 0,2,4,6,8,9,10,11,12 | 0,2,4,6,8,9,10,11,12 | 0,2,4,6,8,9,10,11,12 |
| OP | 37 | 38 | 39 | 40 | 41 | 42 | 43 | 44 | 45 | 46 | 47 | 48 |
| OUT | | | | | | | 7 | | | | | |
| IN | | | | 13 | | | 14 | | | | | |
| Buffer | 2,4,6,8,10,11,12,13,14 | 2,4,6,8,9,10,11,12 | 0,2,4,6,8,9,10,11,12 | 0,2,4,6,8,9,10,11,12 | 2,4,6,8,9,10,11,12,13 | 2,4,6,8,9,10,11,12,13 | 2,4,6,8,9,10,11,12,13 | 2,4,6,8,9,10,11,12,13,14 | 2,4,6,8,10,11,12,13,14 | 2,4,6,8,10,11,12,13,14 | 2,4,6,8,10,11,12,13,14 | 2,4,6,8,10,11,12,13,14 |
| OP | 49 | 50 | 51 | 52 | 53 | 54 | 55 | 56 | 57 | 58 | 59 | 60 |
| OUT | | | | 0 | | | | 9 | | | | |
| IN | | | | 15 | | | | | 16 | | | |
| Buffer | 4,6,8,10,11,12,13,14,15 | 4,6,8,10,11,12,13,14,15 | 4,6,8,10,11,12,13,14,15,16 | 4,6,8,10,11,12,13,14,15 | 4,6,8,10,11,12,13,14,15 | 4,6,8,10,11,12,13,14,15 | 4,6,8,10,11,12,13,14,15 | 4,6,8,10,11,12,13,14,15 | 4,6,8,10,12,13,14,15,16 | 4,6,8,10,12,13,14,15,16 | 4,6,8,10,12,13,14,15,16 | 4,6,8,10,12,13,14,15,16 |
| OP | 61 | 62 | 63 | 64 | 65 | 66 | 67 | 68 | 69 | 70 | 71 | 72 |
| OUT | | | | 2 | | | | 11 | | | | |
| IN | | | | | | | | | | | | |
| Buffer | 4,6,8,10,12,13,14,15,16 | 4,6,8,10,12,13,14,15,16 | 6,8,10,12,13,14,15,16 | 6,8,10,12,13,14,15,16 | 6,8,10,12,13,14,15,16 | 6,8,10,12,13,14,15,16 | 6,8,10,12,13,14,15,16 | 6,8,10,12,14,15,16 | 6,8,10,12,14,15,16 | 6,8,10,12,14,15,16 | 6,8,10,12,14,15,16 | 6,8,10,12,14,15,16 |
| OP | 73 | 74 | 75 | 76 | 77 | 78 | 79 | 80 | 81 | 82 | 83 | 84 |
| OUT | | | | 4 | | | 13 | | | | | |
| IN | | | | | | | | | | | | |
| Buffer | 8,10,12,14,15,16 | 8,10,12,14,15,16 | 8,10,12,14,16 | 8,10,12,14,16 | 8,10,12,14,16 | 8,10,12,14,16 | 8,10,12,14,16 | 8,10,12,14,16 | 10,12,14,16 | 10,12,14,16 | 10,12,14,16 | 10,12,14,16 |
| OP | 85 | 86 | 87 | 88 | 89 | 90 | 91 | 92 | 93 | 94 | 95 | 96 |
| OUT | 6 | 15 | | | 8 | | | 10 | | 12 | |
| IN | | | | | | | | | | | | 14,16 |
| Buffer | | | | | | | | | | | 12,14,16 | 14,16 |
| OP | | | | | | | | | | | | |
| OUT | | | | | | | | | 10 | | 12 | 14,16 |

*fig. 12* figure 14

| IN | 0, 1 | 2 | 3 | | 4 | | 5 | 6 | |
|---|---|---|---|---|---|---|---|---|---|
| Buffer | [0,1] | [0...2] | [0...2] | [0...3] | [0...3] | [0...4] | [0...4] | [0...5] | [0...5] | [0...6] | [0...6] |
| OP | 1 | 2 | 3 | 4 | 5 | 6 | 7 | 8 | 9 | 10 | 11 | 12 |
| OUT | | | | | | | | | | | | |

| IN | | | | | 7 | | | | | | 10 | |
|---|---|---|---|---|---|---|---|---|---|---|---|---|
| Buffer | [0...6] | [0...6] | [0...7] | [0...7] | [0...7] | [0...8] | [0...8] | [0...8] | [0...9] | [0...9] | [0...10] | [0...10] |
| OP | 13 | 14 | 15 | 16 | 17 | 18 | 19 | 20 | 21 | 22 | 23 | 24 |
| OUT | | | | | | | | | | | | |

| IN | | | | | | | | | | | | |
|---|---|---|---|---|---|---|---|---|---|---|---|---|
| Buffer | [0...10] | [0...10] | [0...10] | [0...10] | [0...10] | [0...10] | [0...11] | [0...11] | [0...12] | [0...12] | [0...12] | [0...12] |
| OP | 25 | 26 | 27 | 28 | 29 | 30 | 31 | 32 | 33 | 34 | 35 | 36 |
| OUT | | | | | | | | | | | | |

| IN | | | | | | | 11 | | 12 | | | |
|---|---|---|---|---|---|---|---|---|---|---|---|---|
| Buffer | [0...12] | [0...12] | [0...12] | [0...12] | [0...12] | [1...12] | [2...13] | [2...13] | [2...14] | [2...14] | [2...14] | [2...14] |
| OP | 37 | 38 | 39 | 40 | 41 | 42 | 43 | 44 | 45 | 46 | 47 | 48 |
| OUT | | | | | 0 | 1 | | | | | | |

| IN | | | | | | | 13 | | 14 | | | |
|---|---|---|---|---|---|---|---|---|---|---|---|---|
| Buffer | [2...14] | [2...14] | [4...16] | [4...16] | [4...16] | [3...14] | [2...13] | [4...15] | [4...16] | [4...16] | [4...16] | [4...16] |
| OP | 49 | 50 | 51 | 52 | 53 | 54 | 55 | 56 | 57 | 58 | 59 | 60 |
| OUT | | | | 2 | | 3 | | | | | | |

| IN | | | | | | | 15 | | 16 | | | |
|---|---|---|---|---|---|---|---|---|---|---|---|---|
| Buffer | [4...16] | [4...16] | [4...16] | [4...16] | [5...16] | [3...14] | [4...15] | [4...15] | [4...16] | [6...16] | [6...16] | [6...16] |
| OP | 61 | 62 | 63 | 64 | 65 | 66 | 67 | 68 | 69 | 70 | 71 | 72 |
| OUT | | | | 4 | | 5 | | | | | | |

| IN | | | | | | | | | | | | |
|---|---|---|---|---|---|---|---|---|---|---|---|---|
| Buffer | [6...16] | [7...16] | [7...16] | [8...16] | [8...16] | [8...16] | [8...16] | [8...16] | [9...16] | [9...16] | [10...16] | [10...16] |
| OP | 73 | 74 | 75 | 76 | 77 | 78 | 79 | 80 | 81 | 82 | 83 | 84 |
| OUT | 6 | | 7 | | | | | 8 | | 9 | | |

| IN | | | | | | | | | | | | |
|---|---|---|---|---|---|---|---|---|---|---|---|---|
| Buffer | [10...16] | [10...16] | [11...16] | [11...16] | [12...16] | [12...16] | [12...16] | [13...16] | [13...16] | [14...16] | [14...16] | [15,16] |
| OP | 85 | 86 | 87 | 88 | 89 | 90 | 91 | 92 | 93 | 94 | 95 | 96 |
| OUT | 6 | 10 | | 11 | | | 12 | | 13 | | 14 | 15,16 |

*figure 25*

DIGITAL SIGNAL TRANSFORMATION DEVICE AND METHOD

The present invention concerns digital signal transformation, such as digital filtering.

Many digital filtering methods and devices are known. By way of example, analysis filterings and corresponding synthesis filterings of digital signals are envisaged here. Combined analysis and synthesis filterings are also envisaged.

These filterings are generally sub-assemblies integrated into the coding and/or decoding assemblies. They often require a large random access memory or buffer memory space, for storing the data being processed.

The present invention provides a digital signal transformation method and device which minimises the buffer memory occupancy of the data being processed.

To this end, the invention proposes a digital signal transformation method, original samples of the digital signal being transformed into output samples, any output sample being calculated by a function of original samples, and/or of intermediate samples, and/or of output samples.

characterised in that:
  each function is broken down into elementary operations;
  the elementary operations of all the functions are ordered so that the number of samples necessary simultaneously is a minimum.

By virtue of the invention, the buffer memory occupancy of the data being processed is reduced compared with the prior art. Thus, powerful filterings can be integrated into many appliances, without these requiring very large memories.

According to preferred and alternative characteristics:
  the transformation is a filtering for analysis of the digital signal into interlaced frequency sub-band signals,
  the transformation is a filtering for synthesis of a digital signal analyzed into interlaced frequency sub-band signals, into a synthesized signal or
  the transformation is a filtering for analysis of a digital signal into interlaced frequency sub-band signals, combined with a filtering for synthesis of the signal analyzed into interlaced frequency sub-band signals, into a synthesized signal.

These transformations are frequently used in coding and decoding methods and devices, and for this reason it is of interest to improve their implementation by virtue of the present invention.

According to a preferred characteristic, the elementary operations are functions of samples, at least one multiplying factor of which is equal to one. The calculations require fewer multiplications and are thus simplified.

According to another preferred characteristic, the output samples are multiplied by a normalization factor.

According to preferred characteristics, the digital signal is an image signal and the original samples are lines or columns of the image. The invention applies advantageously to an image signal, which generally requires a large memory space. This memory space is reduced by virtue of the invention.

Correlatively, the invention proposes a digital signal transformation device, original samples of the digital signal being transformed into output samples, the device having means for calculating any output sample by a function of original samples, and/or of intermediate samples, and/or of output samples, characterised in that the calculation means are adapted to:
  break down each function into elementary operations;
  order the elementary operations of all the functions so that the number of samples necessary simultaneously is a minimum.

The device has means of implementing the characteristics explained previously.

The invention also concerns a digital apparatus including the transformation device or means of implementing the transformation method. This digital apparatus is for example a digital camera, a computer, a facsimile machine, a photocopier, a scanner or a printer.

The advantages of the device and the digital apparatus are identical to those explained previously.

A means of storing information, readable by a computer or a microprocessor, integrated or otherwise with the device, possibly removable, stores a program implementing the filtering method.

Figure 2:
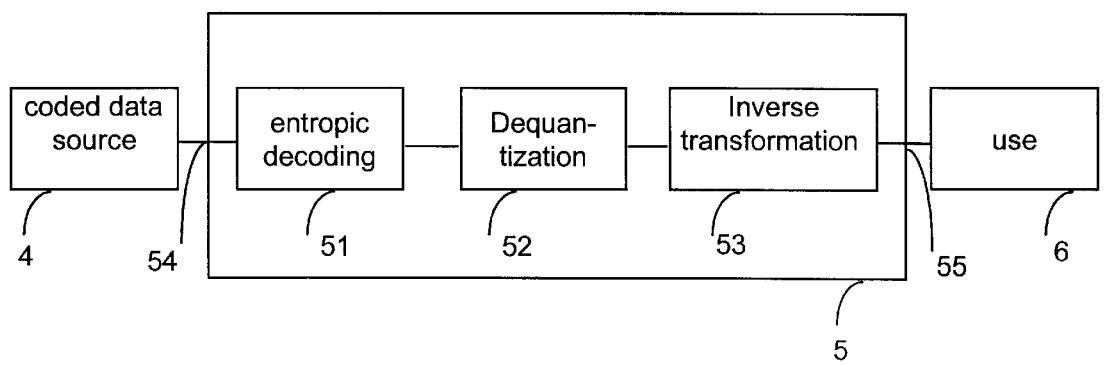
Figure 3:
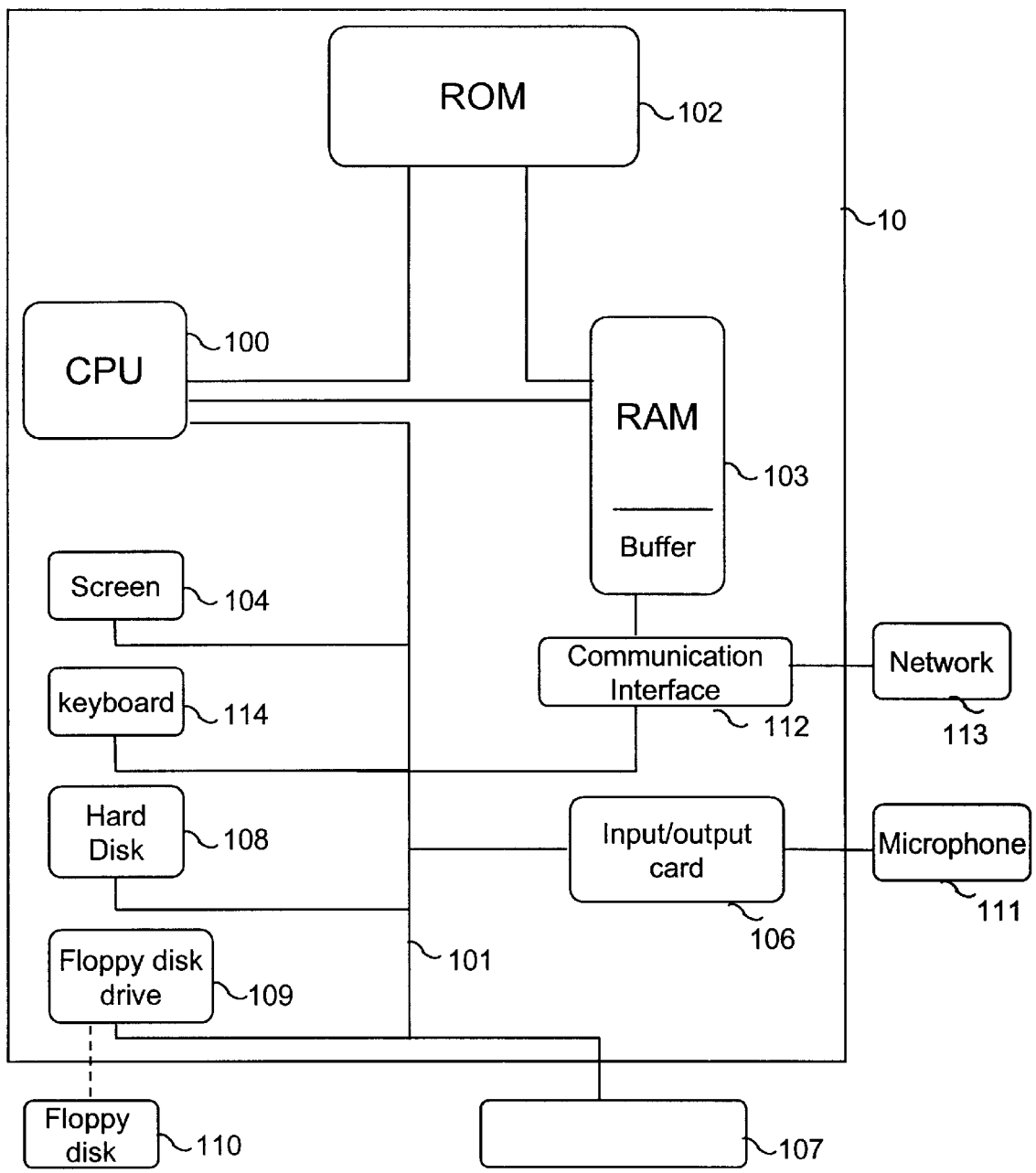
Figure 4:
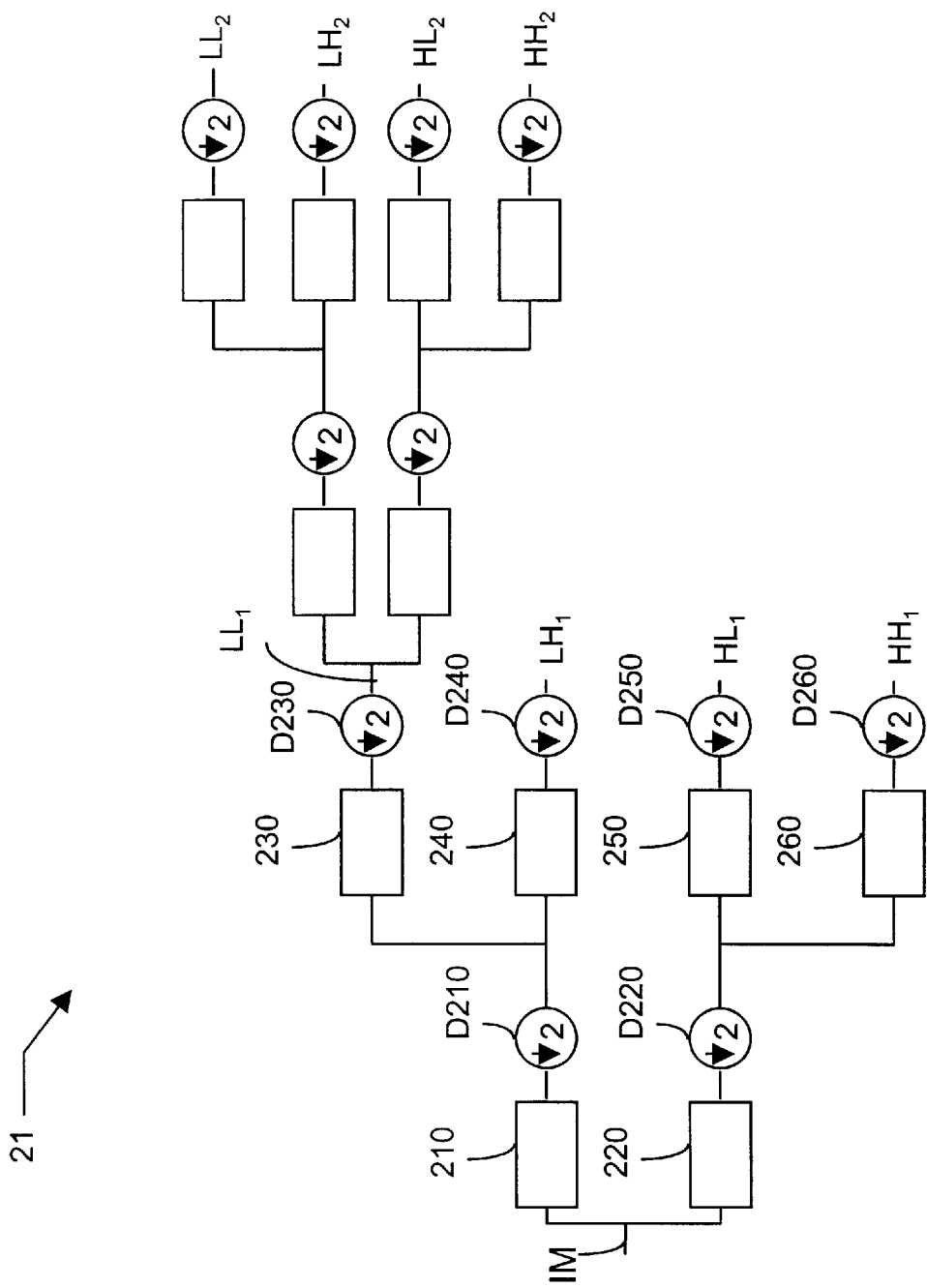
Figure 6:
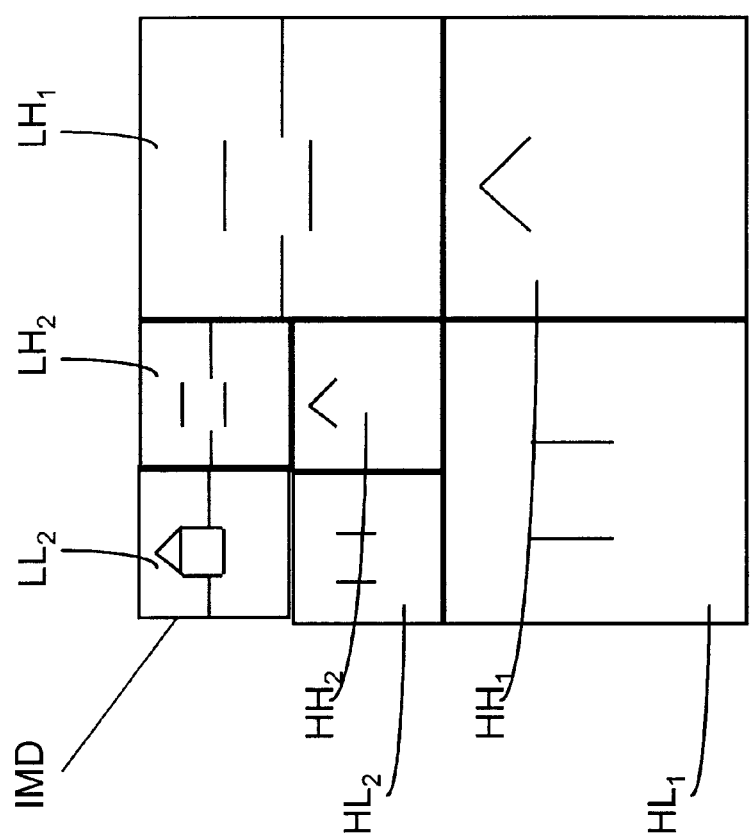
Figure 5:
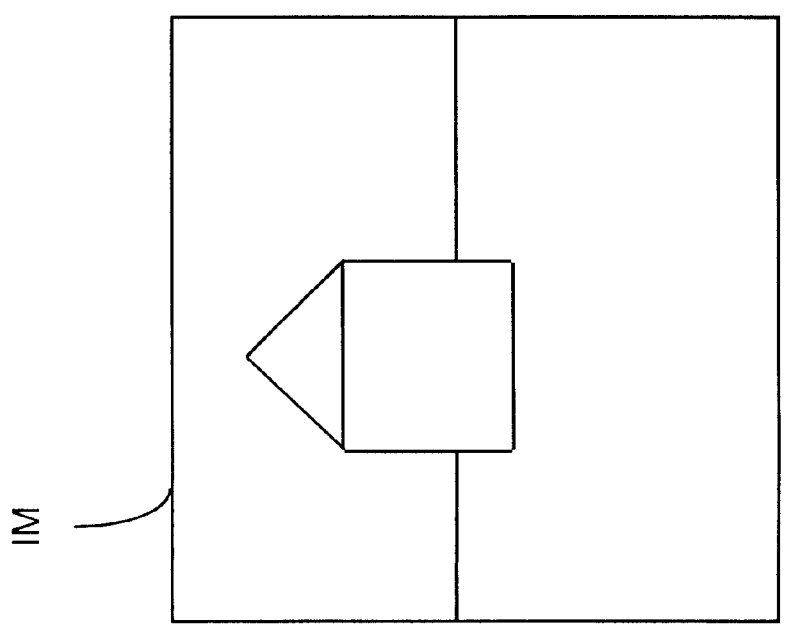
Figure 7:
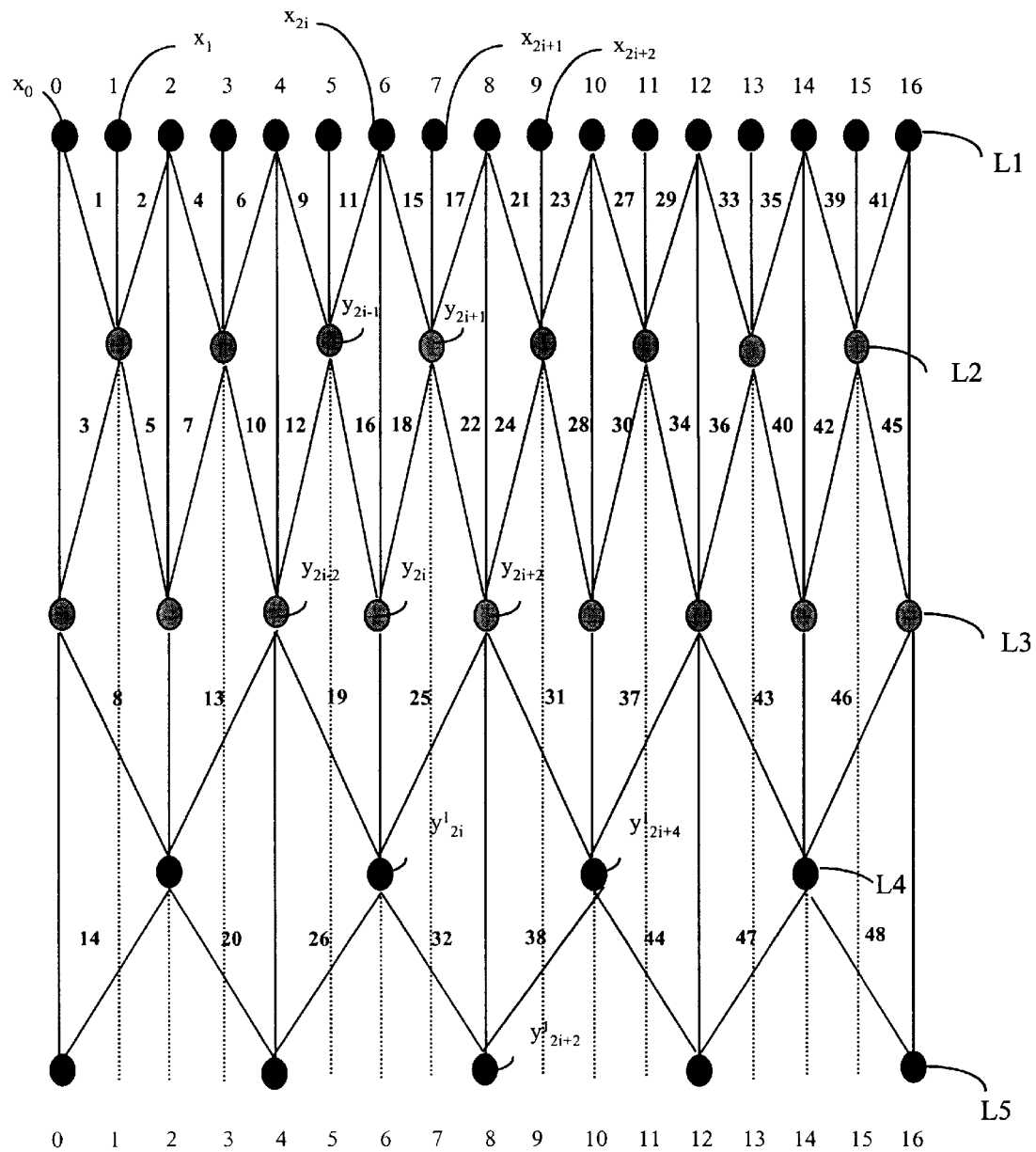
Figure 9:
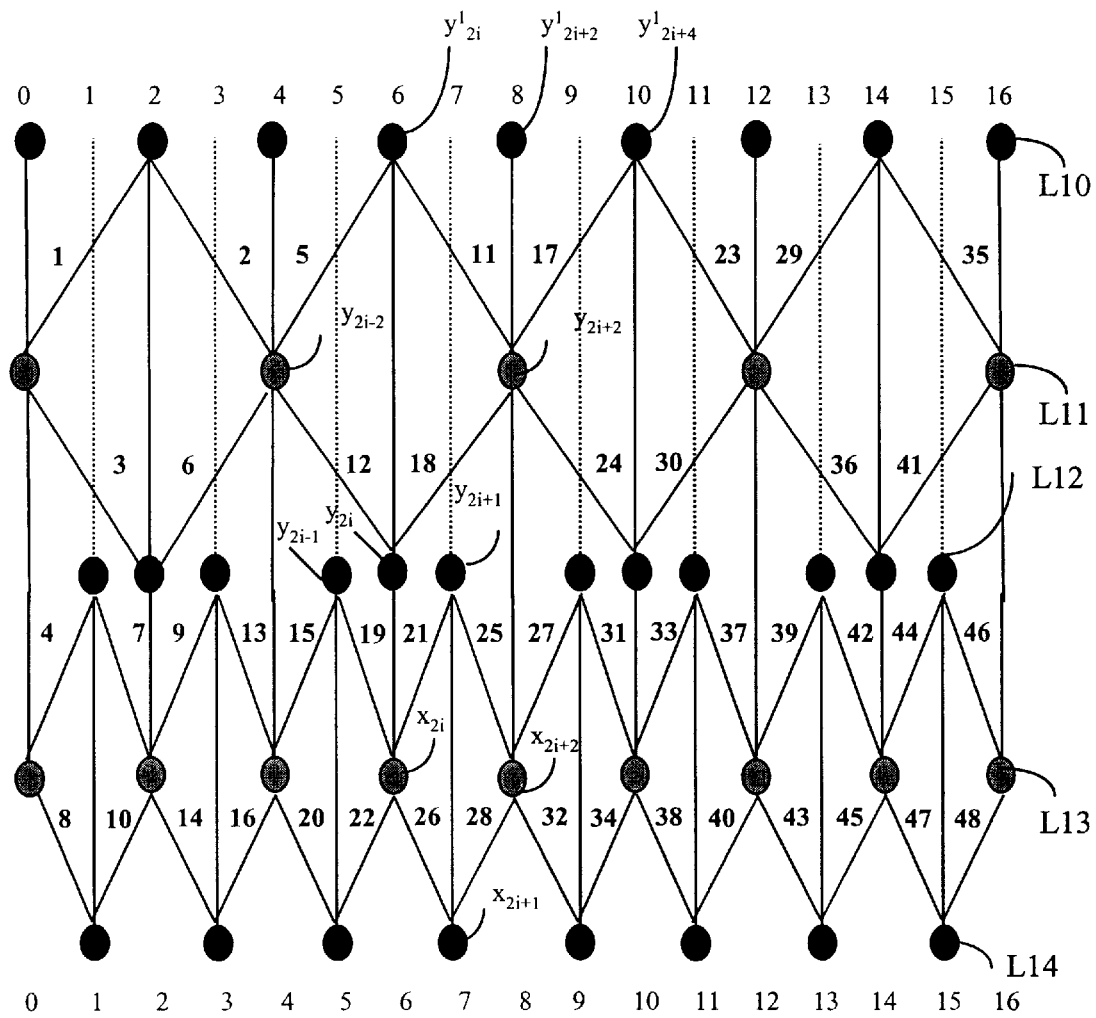
Figure 11:
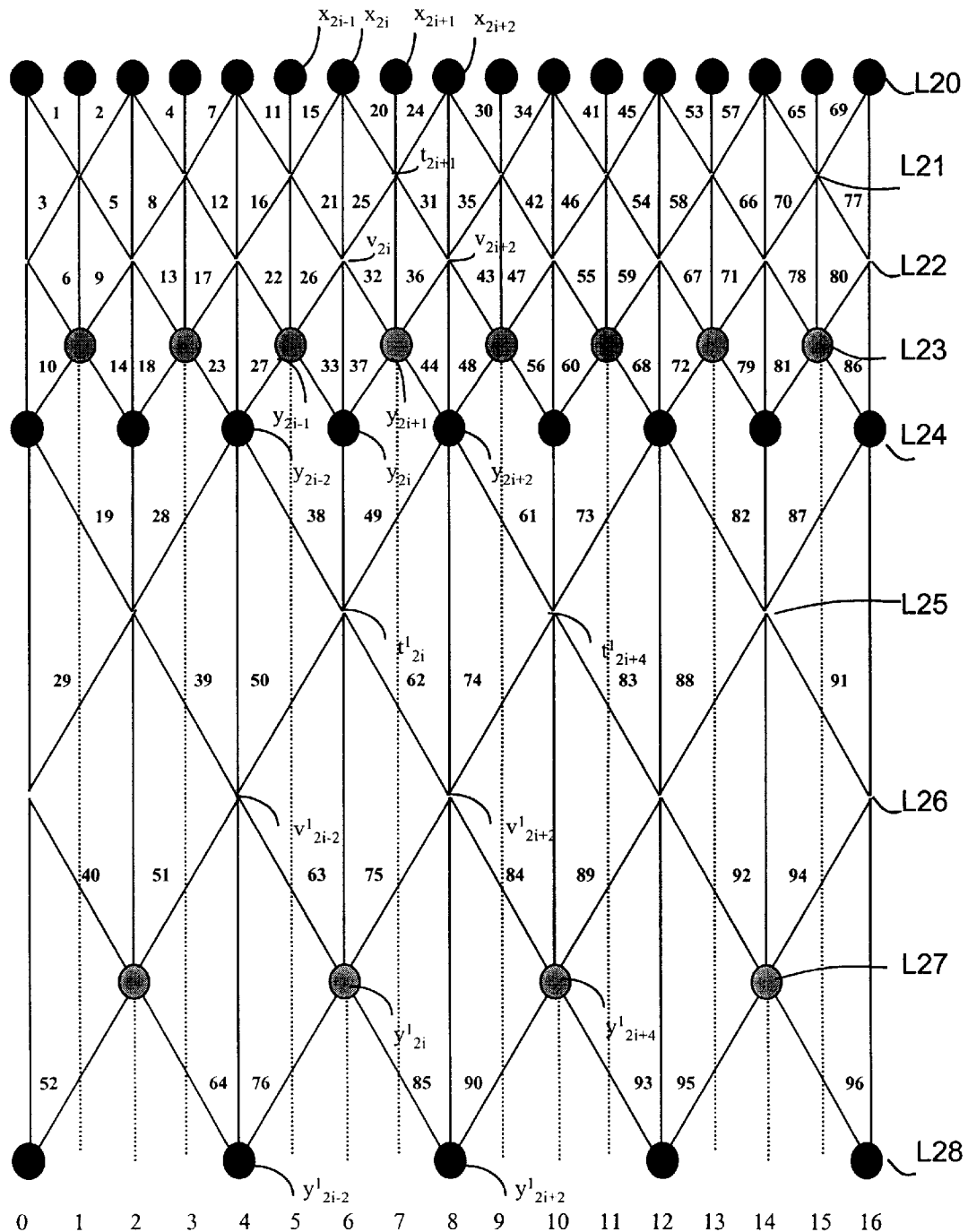
Figure 13:
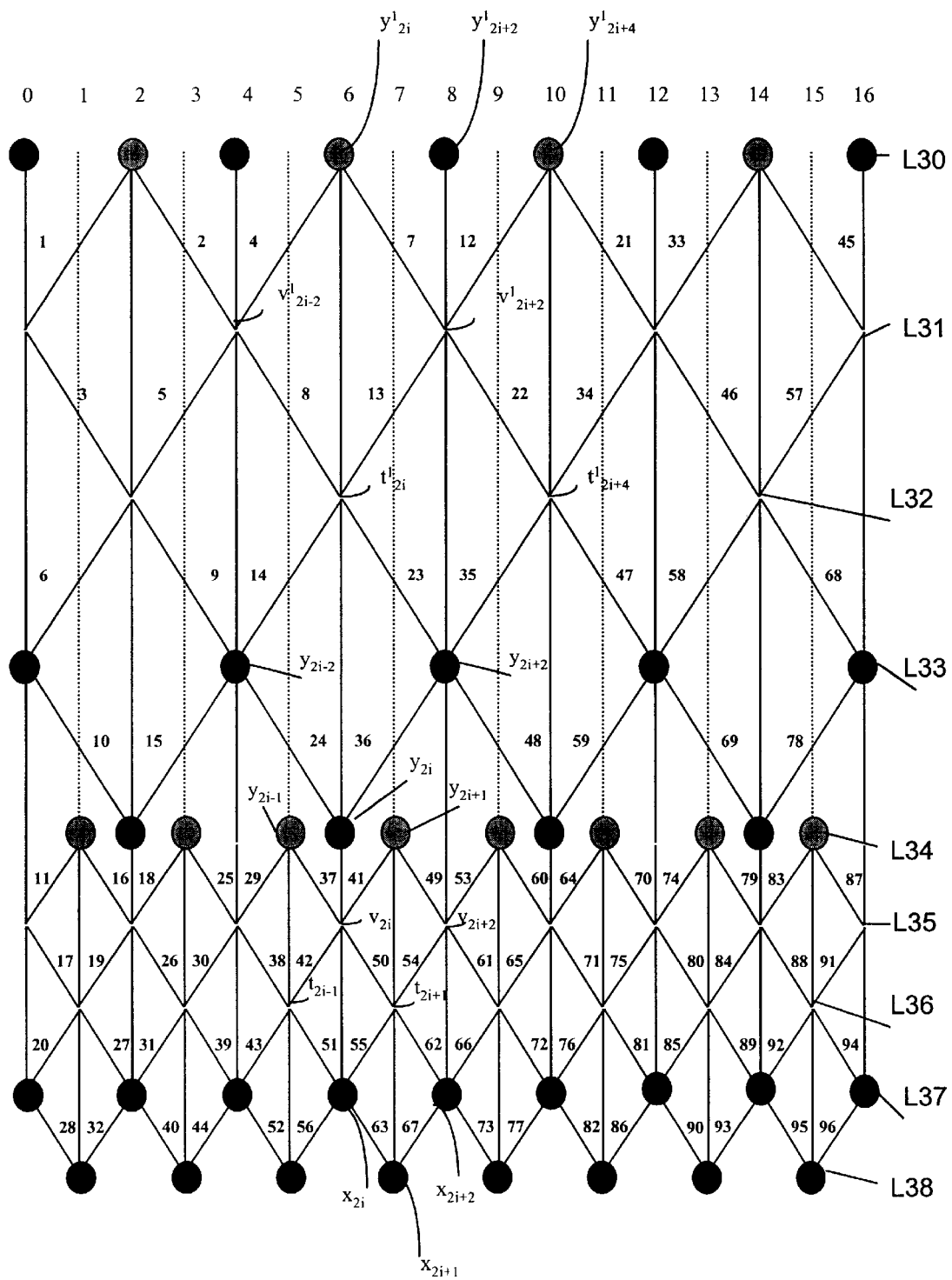
Figure 15:
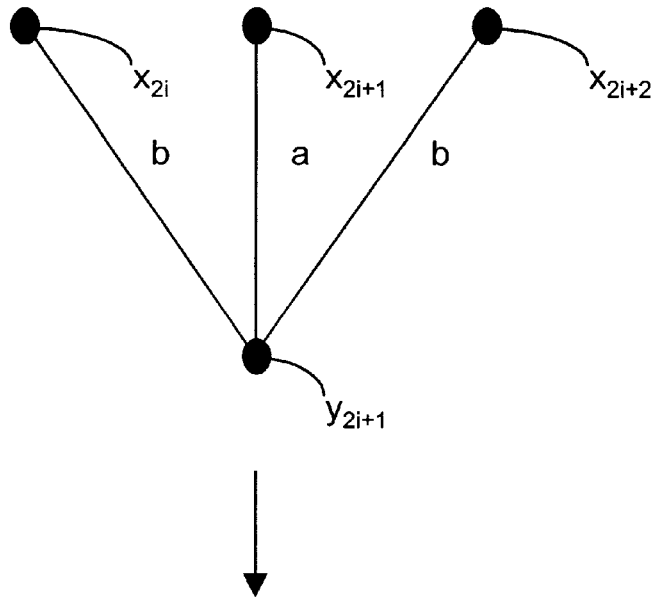
Figure 15:
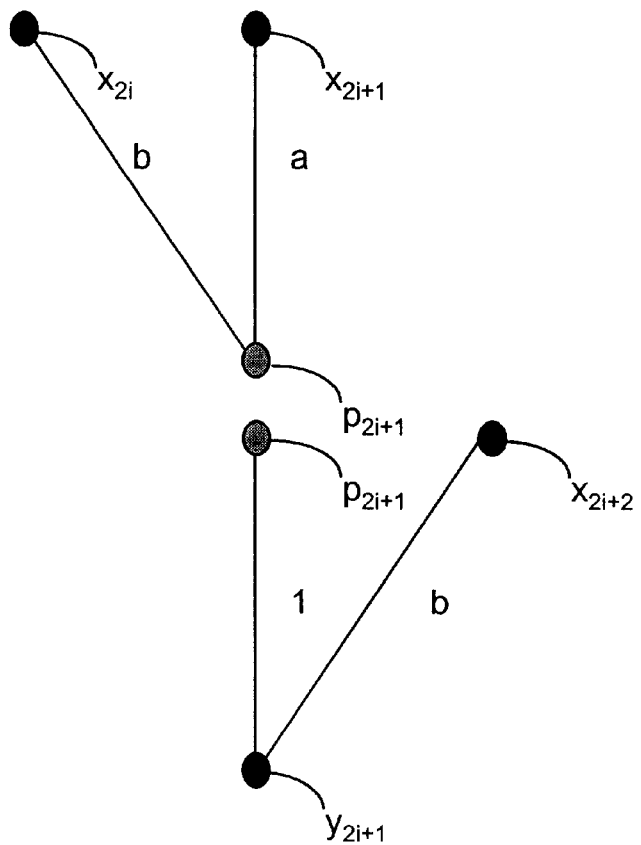
Figure 16:
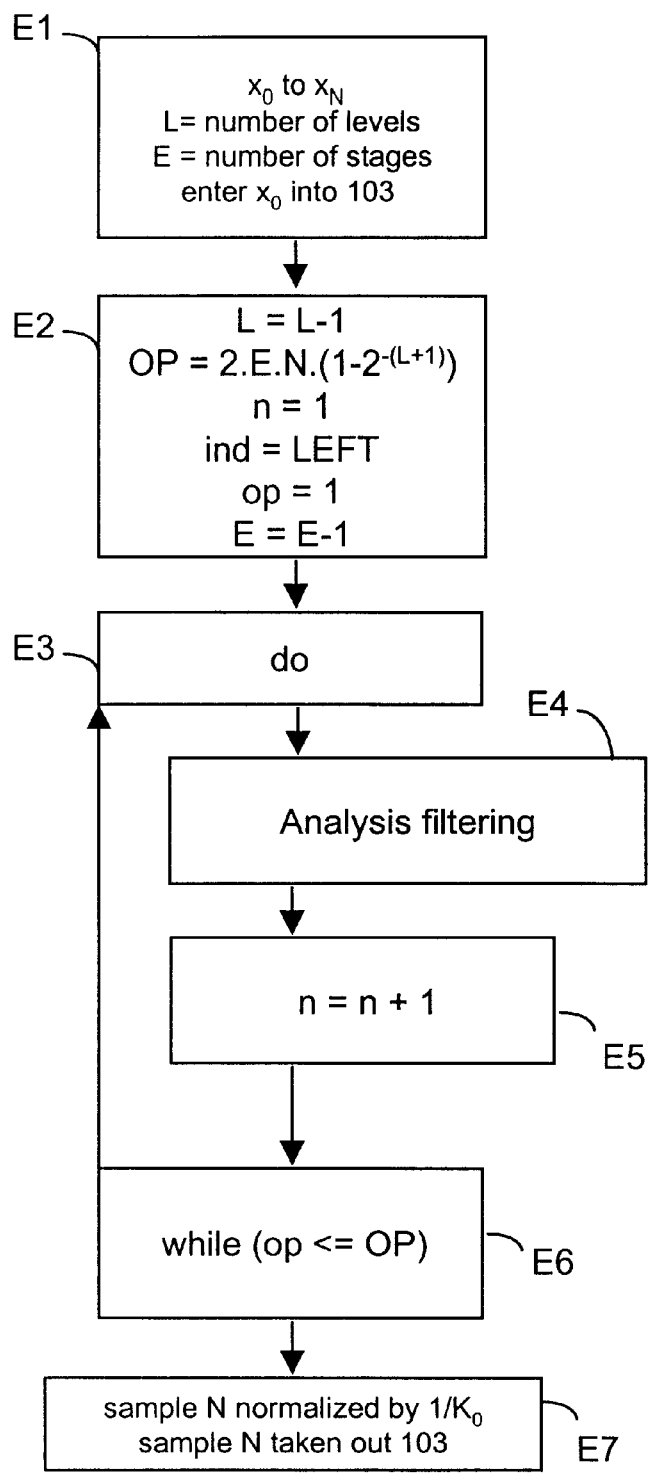
Figure 17:
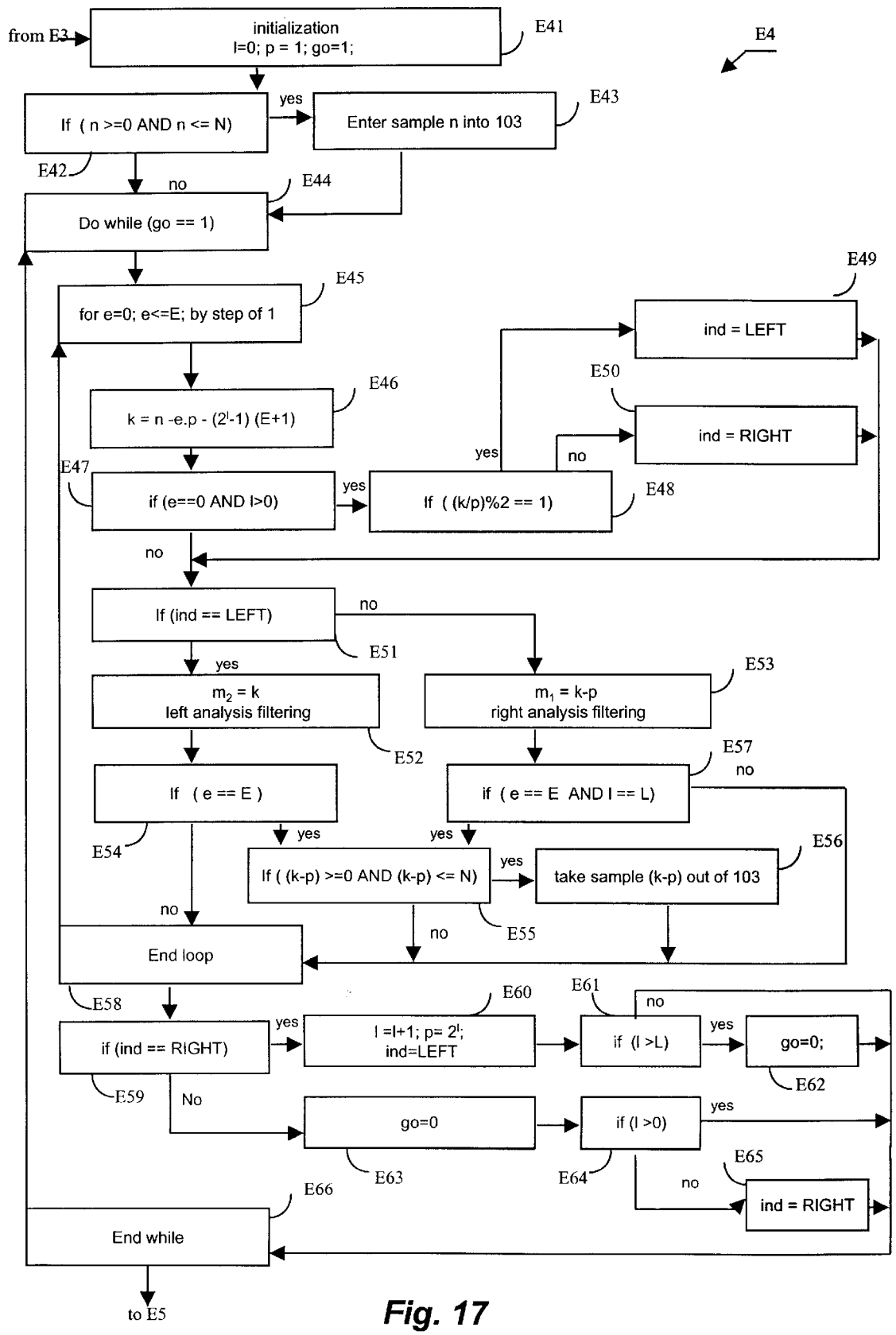
Figure 18:
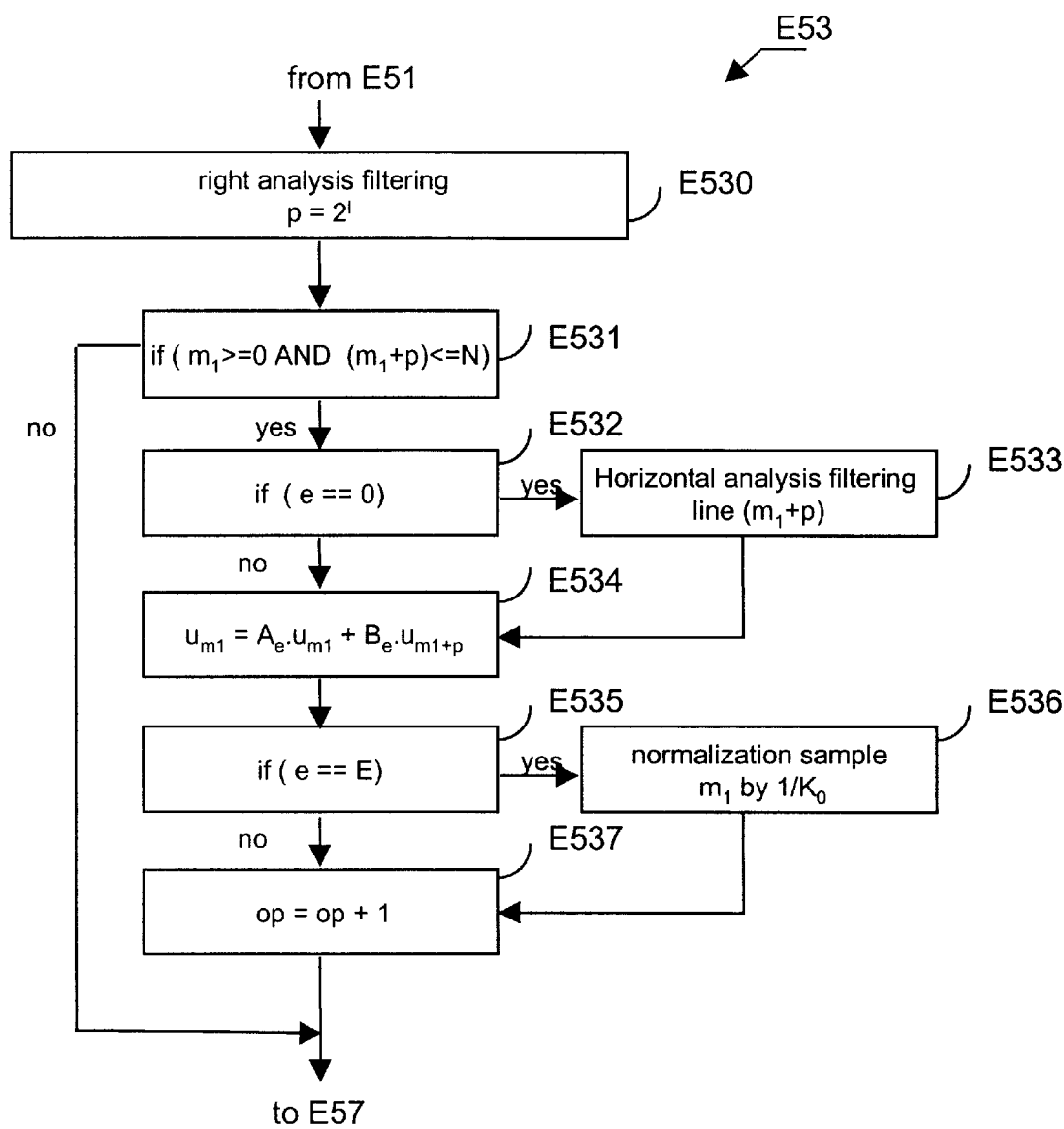
Figure 19:
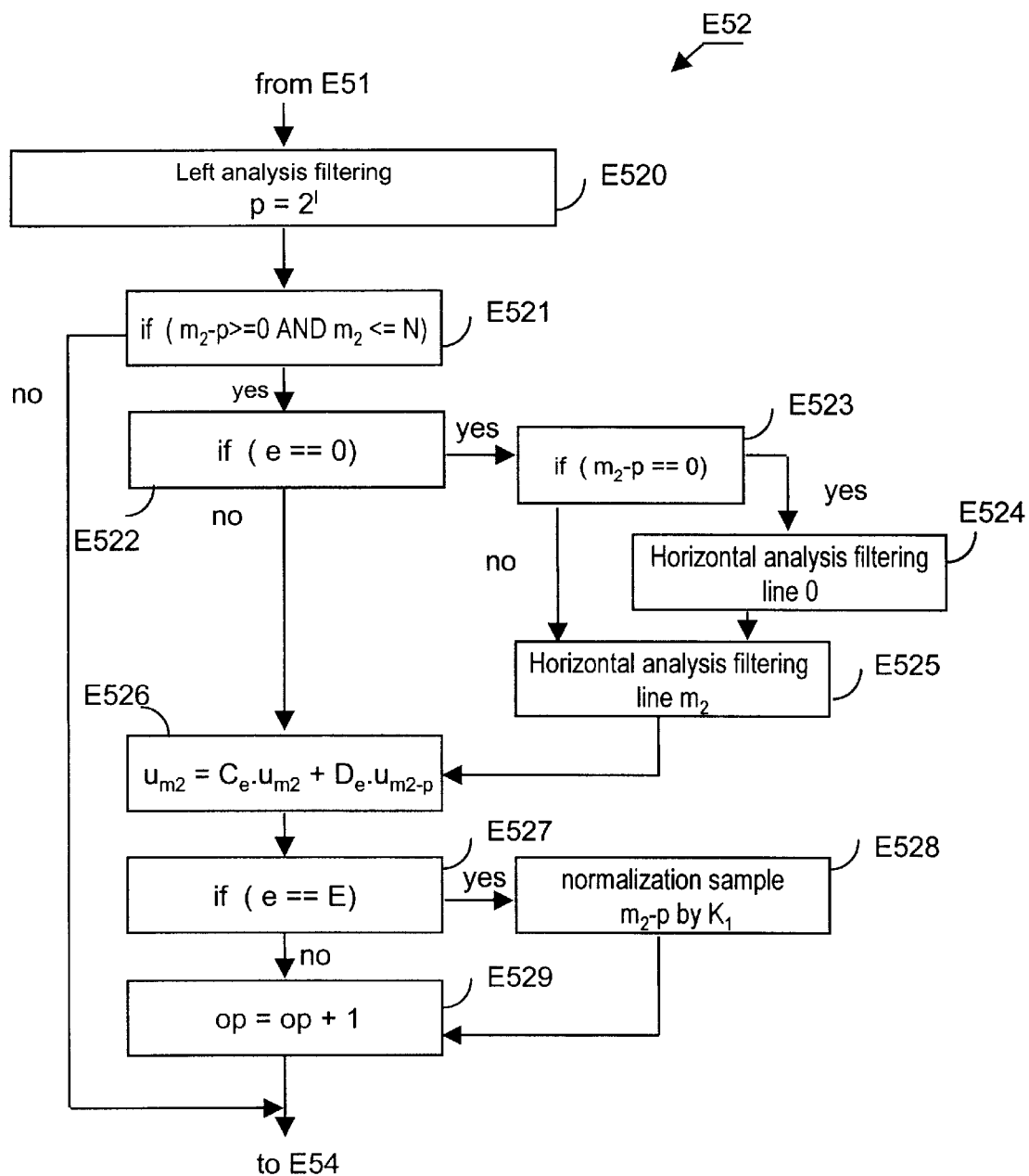
Figure 20:
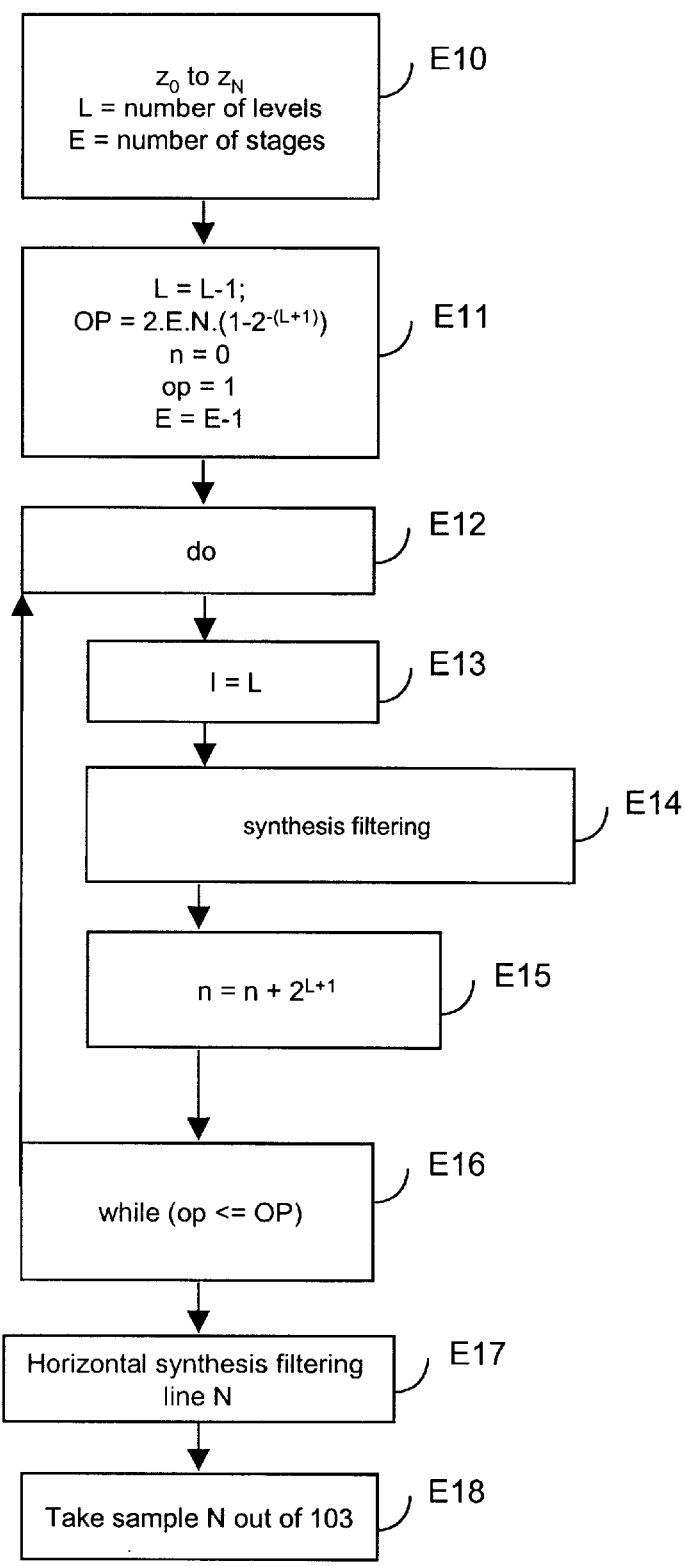
Figure 21:
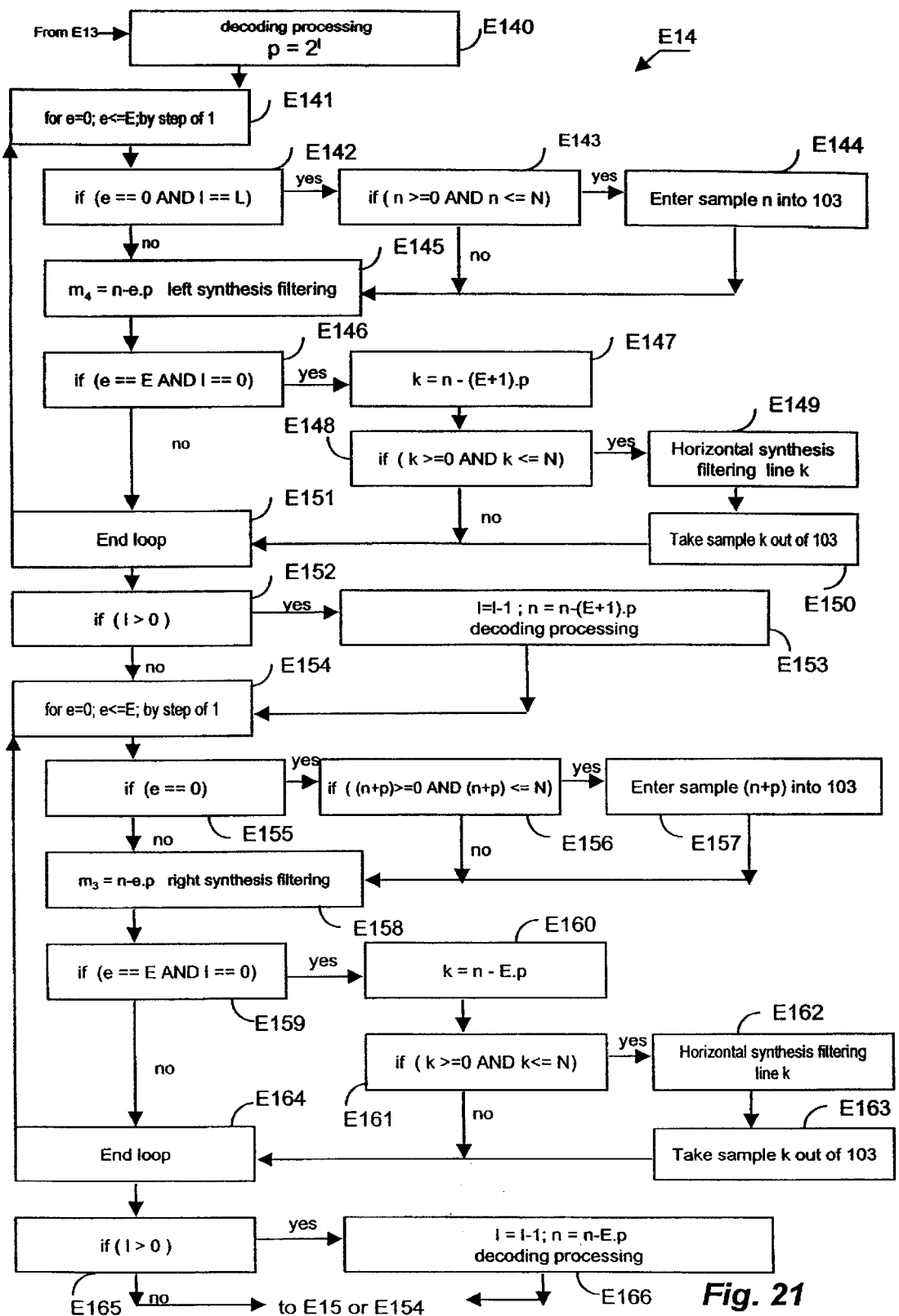
Figure 22:
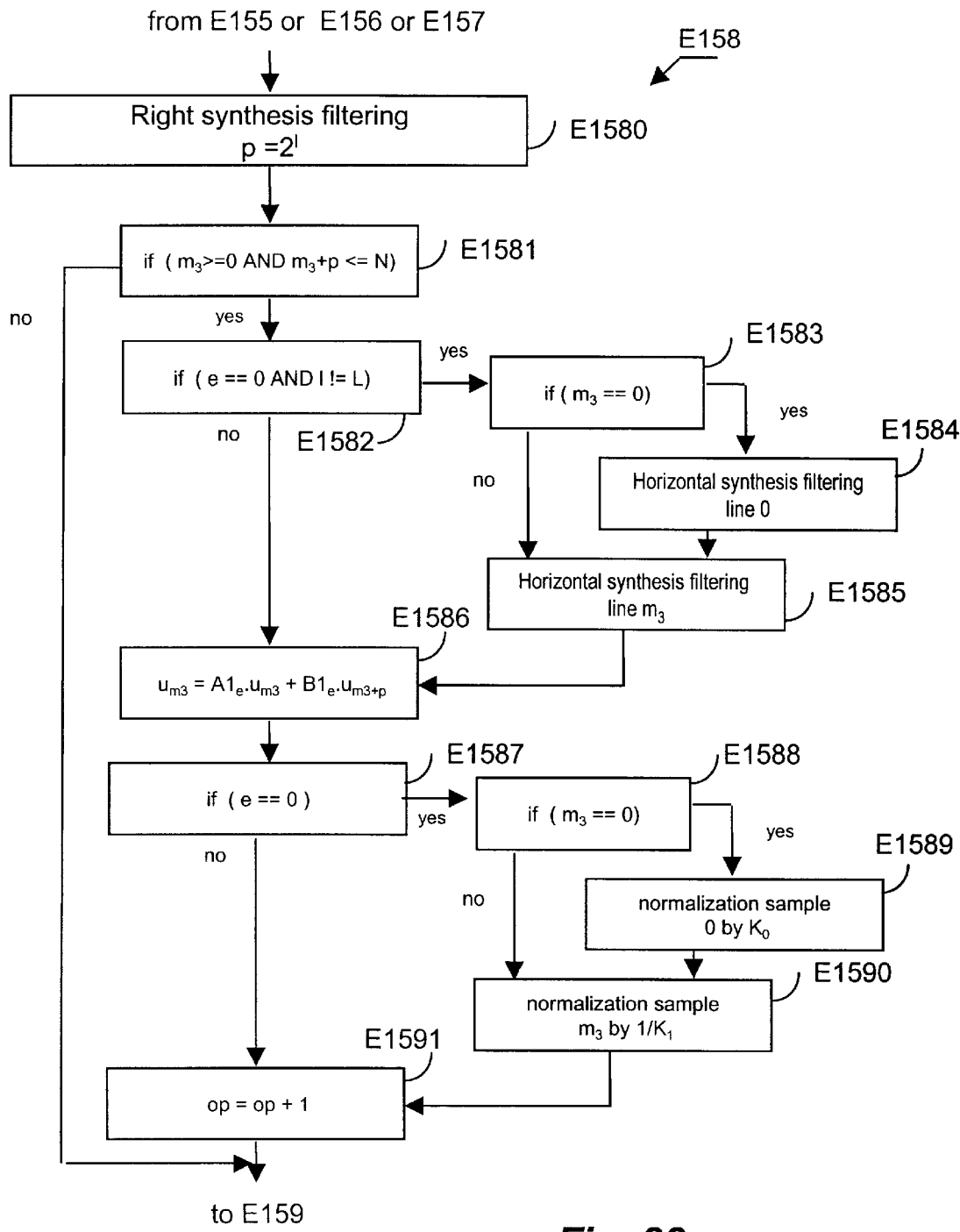
Figure 23:
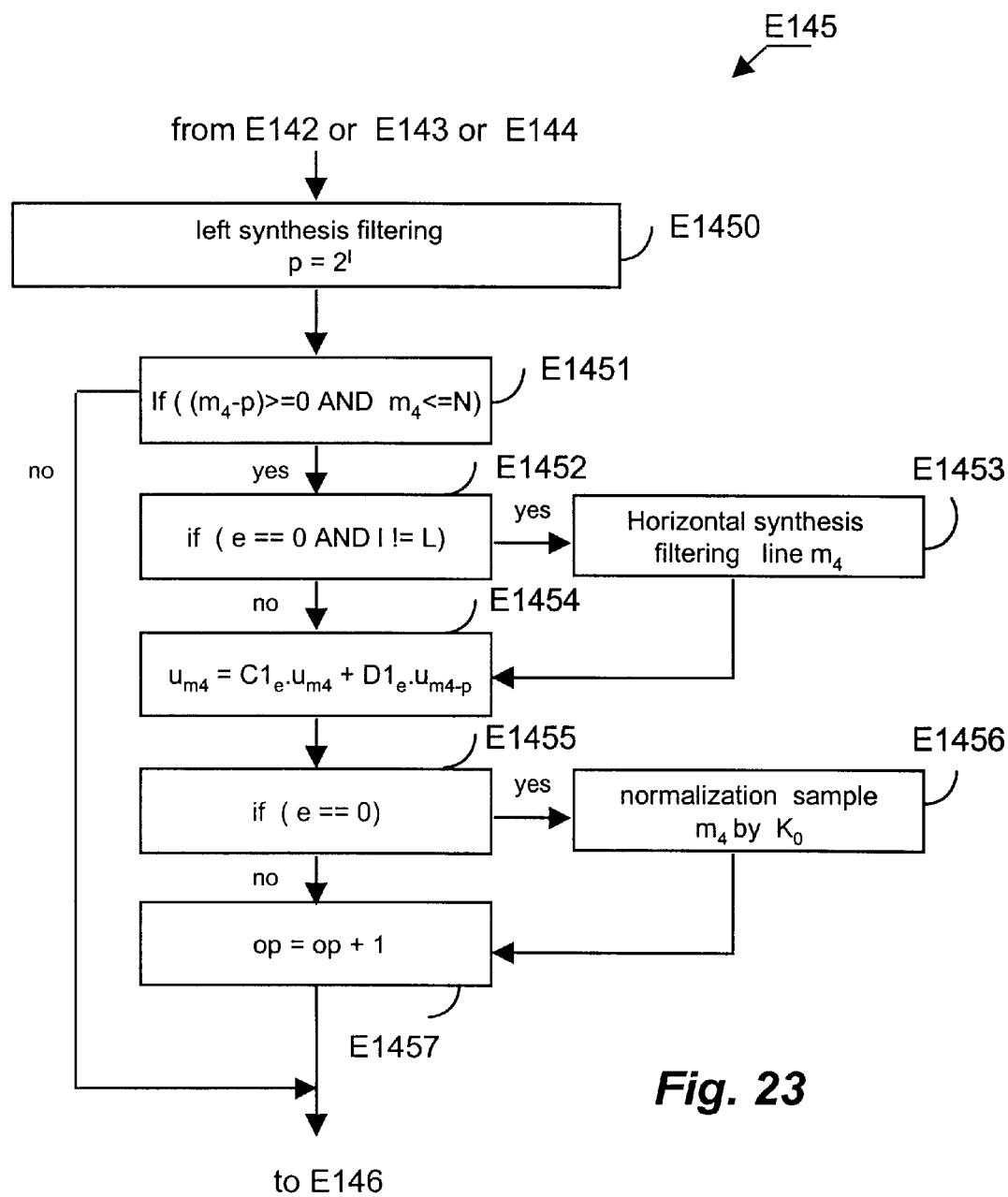
Figure 24:
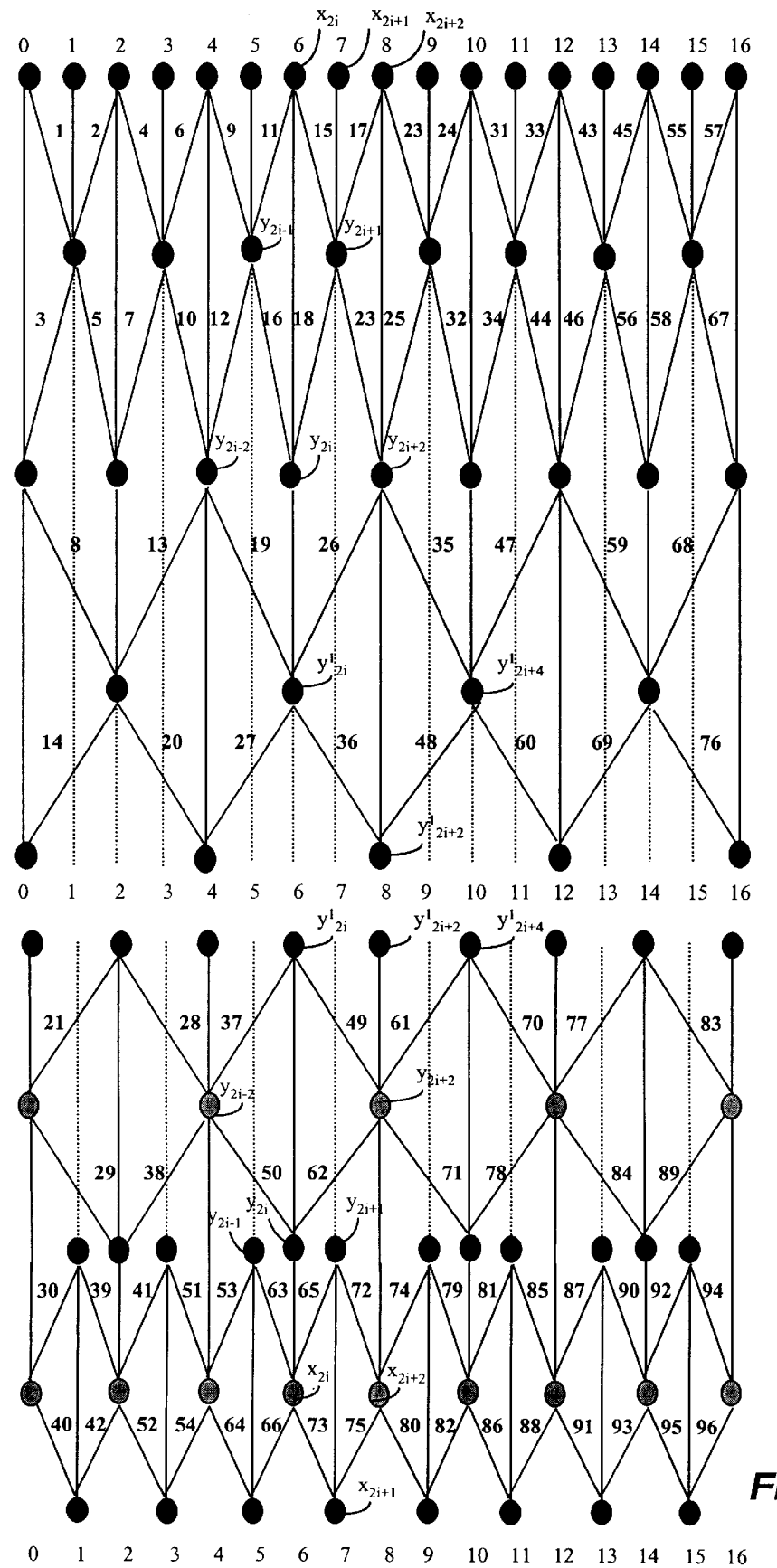
Figure 26:
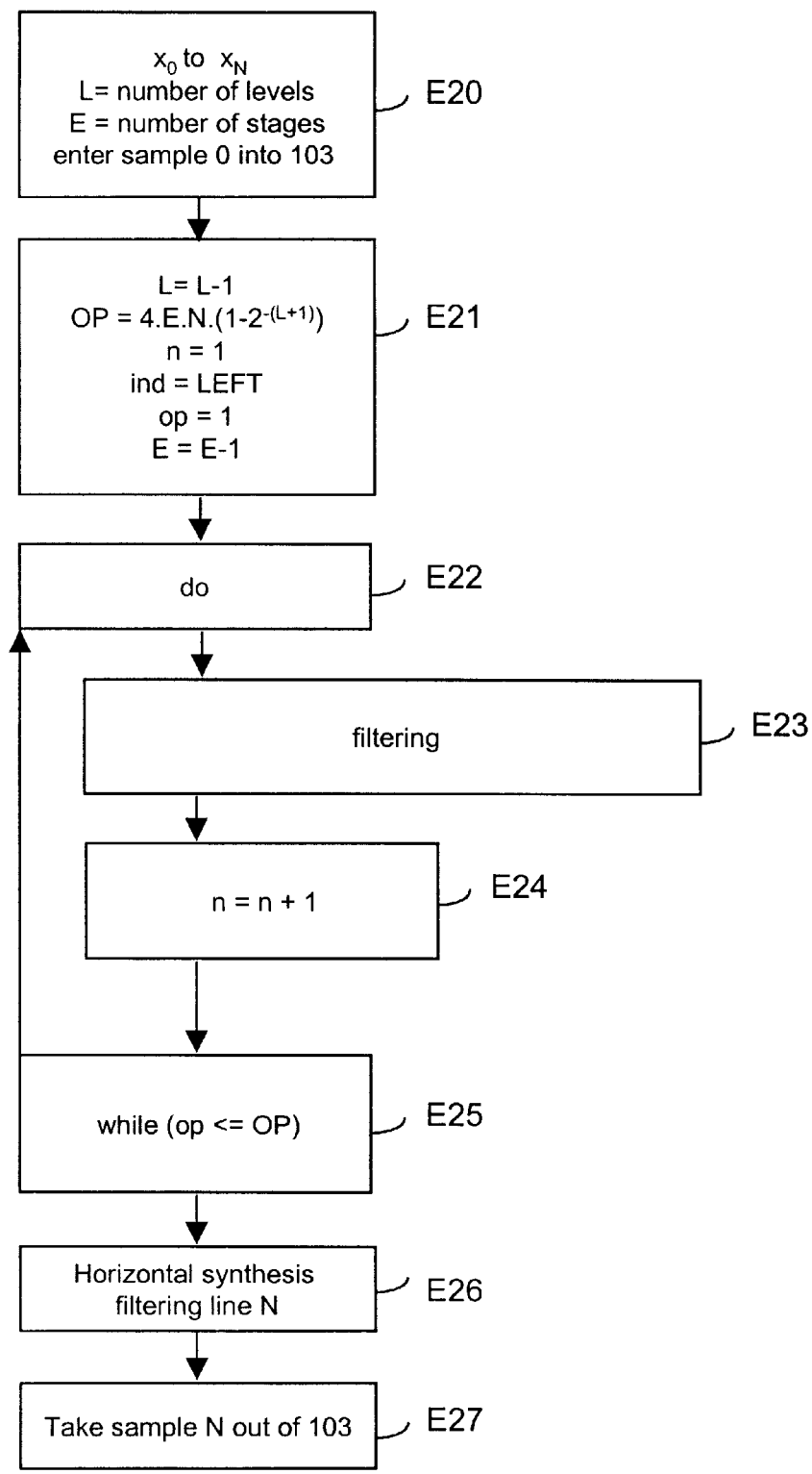
Figure 27:
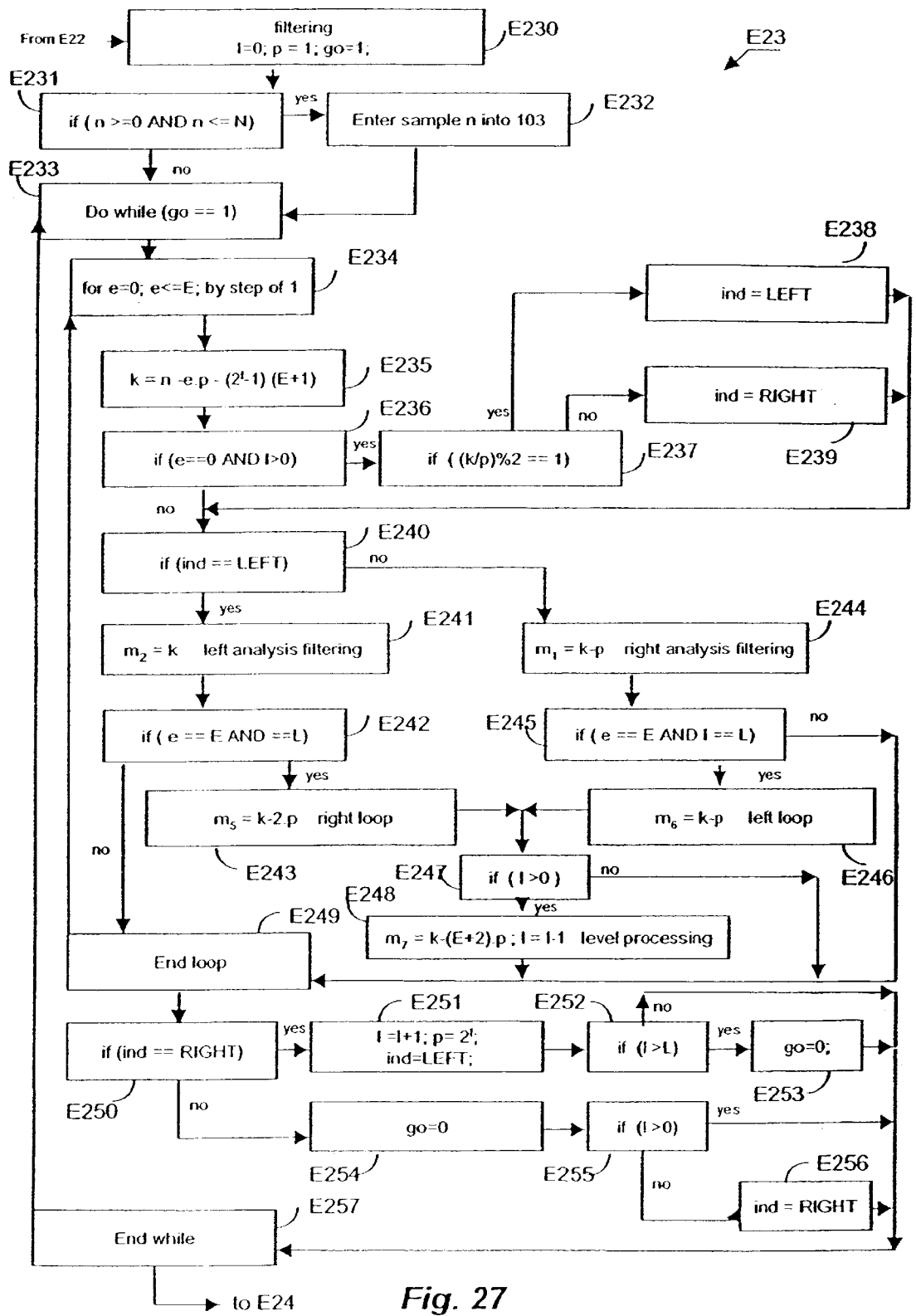
Figure 28:
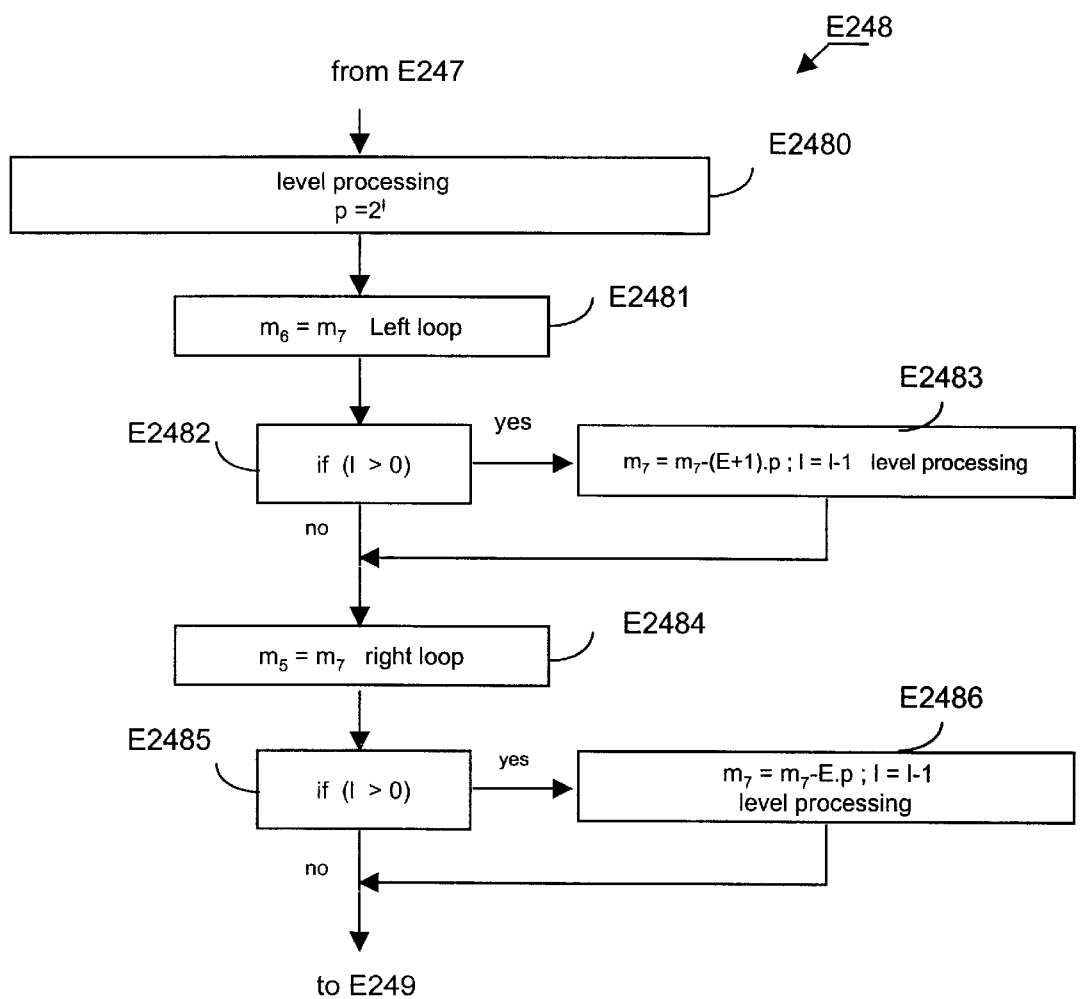
Figure 29:
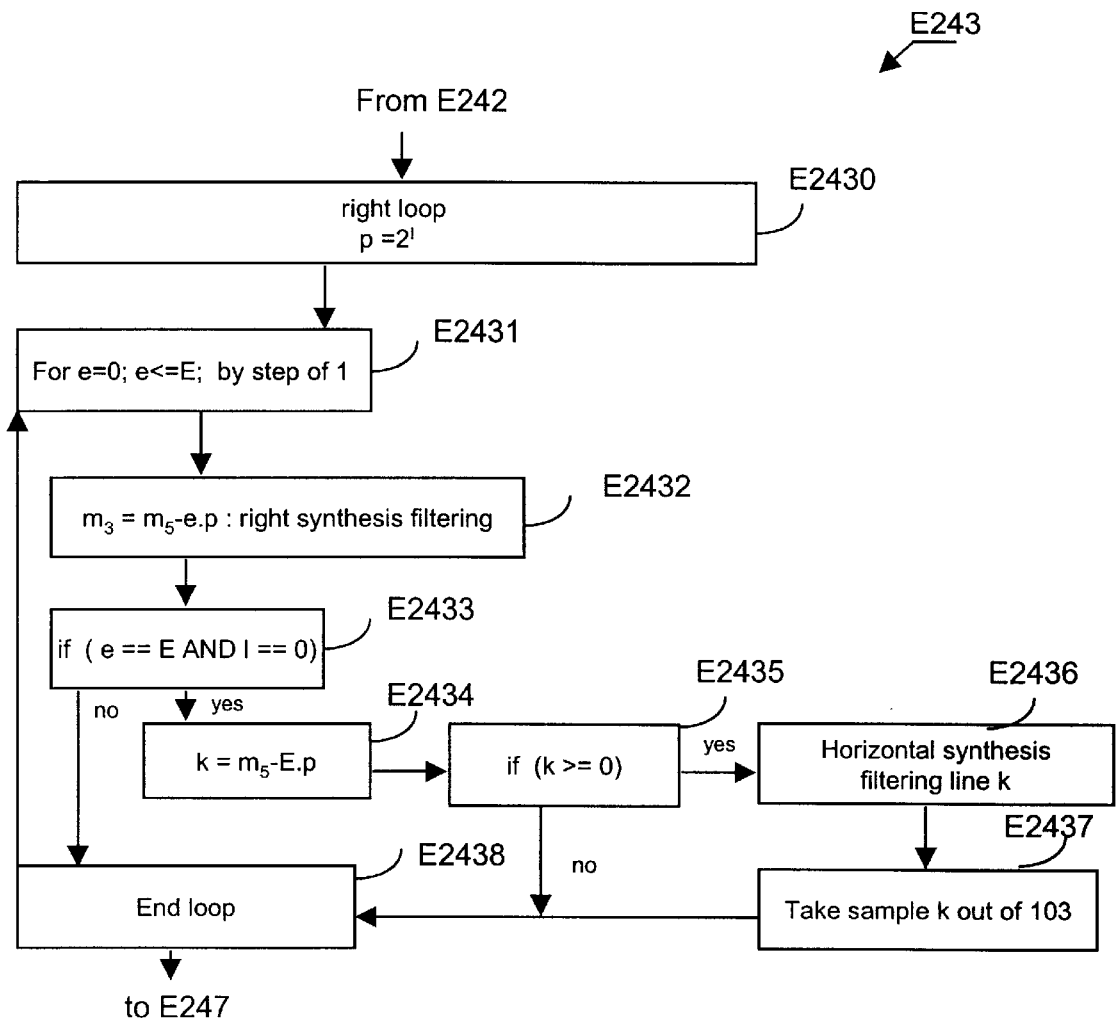
Figure 30:
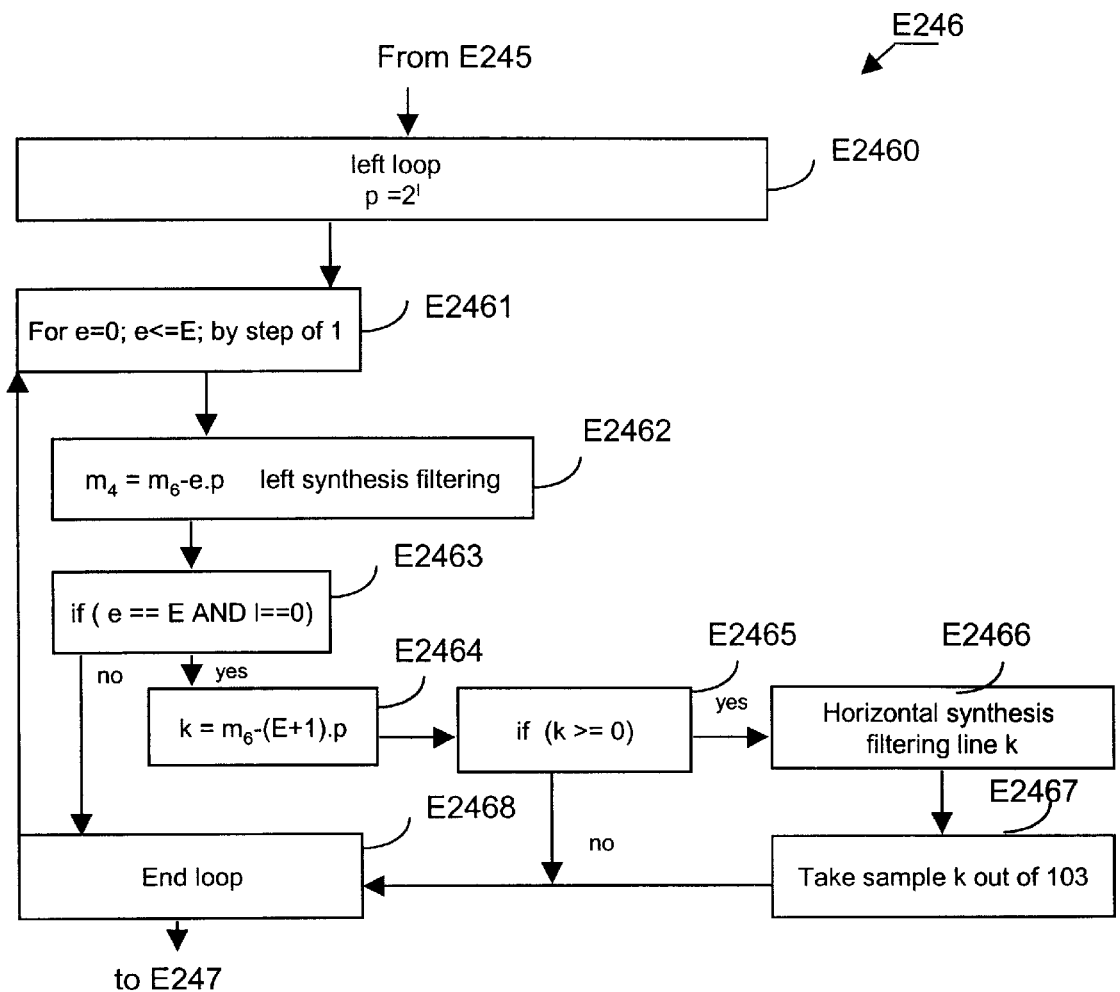

The characteristics and advantages of the present invention will emerge more clearly from a reading of a preferred embodiment illustrated by the accompanying drawings, in which:

FIG. 1 depicts schematically a data processing device according to the invention, FIG. 2 depicts schematically another data processing device according to the invention, FIG. 3 depicts one embodiment of the data processing device according to the invention, FIG. 4 depicts one embodiment of a transformation circuit included in the data processing device of FIG. 1, FIG. 5 is an image to be coded according to the invention, FIG. 6 is an image transformed according to the invention, FIG. 7 is a trellis representing the operation of a transformation circuit according to the invention, FIG. 8 is a table summarizing the operations of the transformation circuit according to FIG. 7, FIG. 9 is a trellis representing the operation of the transformation circuit which is the inverse of that of FIG. 7, FIG. 10 is a table summarizing the operations of the inverse transformation circuit according to FIG. 9, FIG. 11 is a trellis representing the operation of a transformation circuit according to the invention, FIG. 12 is a table summarizing the operations of the transformation circuit according to FIG. 11, FIG. 13 is a trellis representing the operation of the transformation circuit which is the inverse of that of FIG. 11, FIG. 14 is a table summarizing the operations of the inverse transformation circuit according to FIG. 13, FIG. 15 illustrates the breakdown of an operation into two elementary operations, FIG. 16 is a general flow diagram of vertical analysis filtering according to the invention, FIG. 17 is a flow diagram of filtering included in the flow diagram of FIG. 16, FIG. 18 is a flow diagram of right type analysis filtering included in the flow diagram of FIG. 17, FIG. 19 is a flow diagram of left type analysis filtering included in the flow diagram of FIG. 17, FIG. 20 is a general flow diagram of vertical synthesis filtering according to the invention, FIG. 21 is a flow diagram of filtering included in the flow diagram of FIG. 20, FIG. 22 is a flow diagram of right type synthesis filtering included in the flow diagram of FIG. 21, FIG. 23 is a flow diagram of left type synthesis filtering included in the flow diagram of FIG. 21, FIG. 24 is a trellis representing the operation of a transformation circuit according to the invention, FIG. 25 is a table summarizing the operations of the transformation circuit according to FIG. 24, FIG. 26 is a general flow diagram of vertical analysis and synthesis filtering according to the invention, FIG. 27 is a flow diagram of right type analysis and synthesis filtering included in the flow diagram of FIG. 25, FIG. 28 is a flow diagram of processing included in the flow diagram of FIG. 27, FIG. 29 is a flow diagram of right type synthesis filtering included in the flow diagram of FIG. 27, FIG. 30 is a flow diagram of left type synthesis filtering included in the flow diagram of FIG. 27.

According to one embodiment chosen and depicted in FIG. 1, a data processing device according to the invention is a data coding device 2 which has an input 24 to which a source 1 of uncoded data is connected.

The source 1 has for example a memory means, such as random access memory, hard disk, floppy disk, or compact disk, for storing uncoded data, this memory means being associated with an appropriate reading means for reading data therefrom. A means for recording the data in the memory means may also be provided.

It will be considered more particularly subsequently that the data to be coded are a sequence of digital samples representing an image IM.

The source 1 supplies a digital image signal SI to the input of the coding circuit 2. The image signal SI is a sequence of digital words, for example octets. Each octet value represents a pixel of the image IM, here with 256 grey levels, or a black and white image. The image may be a multispectral image, for example a colour image having components in three frequency bands, of red/green/blue or luminance and chrominance type. Each band is then processed in an analogous manner to the monospectral image.

Coded data user means 3 are connected to the output 25 of the coding device 2.

The user means 3 have for example coded data storage means, and/or coded data transmission means.

The coding device 2 conventionally has, from the input 24, a transformation circuit 21, more particularly concerned by the present invention, a number of embodiments of which will be detailed subsequently. The transformations envisaged here are breakdowns into frequency sub-band signals of the data signal, so as to perform an analysis of the signal.

The transformation circuit 21 is connected to a quantization circuit 22. The quantization circuit implements a quantization known per se, for example a scalar quantization, or a vectorial quantization, of the coefficients, or groups of coefficients, of the frequency sub-band signals supplied by the circuit 21.

The circuit 22 is connected to an entropic coding circuit 23, which performs an entropic coding, for example a Huffman coding, or an arithmetic coding, of the data quantized by the circuit 22.

FIG. 2 depicts another data processing device according to the invention, in the form of a device 5 for decoding data coded by the device 2.

Coded data user means 4 are connected to the input 54 of the decoding device 5. The means 4 have for example coded data memory means, and/or coded data receiving means which are adapted to receive the coded data transmitted by the transmission means 3.

Decoded data user means 6 are connected to the output 55 of the decoding device 5. The user means 6 are for example image display means, or sound reproduction means, depending on the nature of the processed data.

Overall, the decoding device 5 performs operations which are the inverse of those of the coding device 2. The device 5 has an entropic decoding circuit 51, which performs an entropic decoding corresponding to the coding of the circuit 23. The circuit 51 is connected to a dequantization circuit 52, corresponding to the quantization circuit 22. The circuit 52 is connected to an inverse transformation circuit 53, corresponding to the transformation circuit 21. The inverse transformation circuit 53 is more particularly concerned by the present invention. A number of embodiments will be detailed subsequently. The transformations envisaged here carry out a synthesis of the digital signal, from frequency sub-band signals.

The coding device and/or the decoding device may be integrated into a digital apparatus, such as a computer, a printer, a facsimile machine, a scanner or a digital camera, for example.

The coding device and the decoding device may be integrated into one and the same digital apparatus, for example a digital camera. In this case, the data processing device carries out the coding and decoding of the data in a combined manner, as explained subsequently.

With reference to FIG. 3, an example of a device 10 implementing the invention is described. This device is adapted to transform a digital signal and, in accordance with the examples developed subsequently, analyze it, or synthesize it, or analyze it and then synthesize it.

The device 10 is here a microcomputer having a communication bus 101 to which the following are connected:

a central unit 100, a read-only memory 102, a random access memory 103, a screen 104, a keyboard 114, a hard disk 108, a floppy disk drive 109 adapted to receive a floppy disk 110, an interface 112 for communication with a communication network 113, an input/output card 106 connected to a microphone 111.

The hard disk 108 stores the programs implementing the invention, and which will be described subsequently, as well as the data to be coded and the data coded according to the invention. These programs may also be read from the floppy disk 110, or received via the communication network 113, or stored in read-only memory 102.

More generally, the programs according to the present invention are stored in a storage means. This storage means can be read by a computer or a microprocessor. This storage means is integrated or otherwise with the device, and may be removable. For example, it may consist of a magnetic tape, a floppy disk or a CD-ROM (a compact disk with fixed memory).

When the device is powered up, the programs according to the present invention are transferred into the random access memory 103 which then contains the executable code of the invention and registers containing the variables necessary for implementation of the invention. The random access memory includes a buffer memory.

The device 10 may receive data to be coded from a peripheral device 107, such as a digital camera, or a scanner, or any other data acquisition or storage means.

The device 10 may also receive data to be coded from a remote device, via the communication network 113, and transmit coded data to a remote device, still via the communication network 113.

The device 10 may also receive data to be coded from the microphone 111. These data are then a sound signal.

The screen 104 allows a user notably to display the data to be coded, and serves, with the keyboard 114, as a user interface.

With reference to FIG. 4, the transformation circuit 21, or analysis circuit, is a two-level dyadic breakdown circuit. The circuit 21 is, in this embodiment, a conventional set of filters, respectively associated with decimators by two, which filter the image signal in two directions, into high and low spatial frequency sub-band signals. The relationship between a high-pass filter and a low-pass filter is determined by the conditions for perfect reconstruction of the signal. Different examples of filters will be envisaged subsequently. It must be noted that the vertical and horizontal breakdown filters are not necessarily identical, although in practice this is generally the case. The circuit 21 has here two successive analysis blocks for breaking down the image IM into sub-band signals according to two resolution levels.

In general, the resolution of a signal is the number of samples per unit length used to represent this signal. In the case of an image signal, the resolution of a sub-band signal is related to the number of samples per unit length used to represent this sub-band signal horizontally and vertically. The resolution depends on the number of decimations performed, the decimation factor and the resolution of the initial image.

The first analysis block receives the digital image signal SI and applies it to two respectively low-pass and high-pass digital filters 210 and 220 which filter the image signal in a first direction, for example horizontal in the case of an image signal. After passing through decimators by two D210 and D220, the resulting filtered signals are respectively applied to two low-pass filters 230 and 250, and high-pass filters 240 and 260, which filter them in a second direction, for example vertical in the case of an image signal. Each resulting filtered signal passes through a respective decimator by two D230, D240, D250 and D260. The first block delivers at its output four sub-band signals $LL_1$, $LH_1$, $HL_1$ and $HH_1$ of resolution $RES_1$, the highest in the breakdown.

The sub-band signal $LL_1$ has the low frequency components, or coefficients, in the two directions, of the image signal. The sub-band signal $LH_1$ has the low frequency components in a first direction and high frequency components in a second direction, of the image signal. The sub-band signal $HL_1$ has the high frequency components in the first direction and the low frequency components in the second direction. Finally, the sub-band signal $HH_1$ has the high-frequency components in both directions.

Each sub-band signal is a set of real coefficients constructed from the original image, which contains information corresponding to a respectively vertical, horizontal and diagonal orientation of the contours of the image, in a given frequency band. Each sub-band signal can be likened to an image.

The sub-band signal $LL_1$ is analyzed by an analysis block analogous to the preceding one in order to supply four sub-band signals $LL_2$, $LH_2$, $HL_2$ and $HH_2$ of resolution level $RES_2$.

Each sub-band signal of resolution $RES_2$ also corresponds to an orientation in the image.

A digital image IM at the output of the image source 1 is depicted schematically in FIG. 5, while FIG. 6 depicts the image IMD resulting from the breakdown of the image IM, into seven sub-bands according to two resolution levels, by the circuit 21. The image IMD has as much information as the original image IM, but the information is divided frequentially according to two resolution levels.

Of course, the number of resolution levels, and consequently sub-bands, can be chosen differently, for example 10 sub-bands over three resolution levels, or 13 sub-bands over four resolution levels, for a two-dimensional signal such as an image. The number of sub-bands per resolution level can also be different. The analysis and synthesis circuits are adapted to the dimension of the processed signal.

In FIG. 6, the coefficients originating from the transformation are arranged sub-band by sub-band. However, the image IMD can also be represented in an equivalent manner according to a so-called interlaced mode, in which the coefficients of the different sub-band signals are grouped together according to their spatial origin in the image. This representation has the advantage that the coefficients of the transformed image can be calculated in place. Subsequently, the concern will be with interlaced representations. The transformation circuits making it possible to obtain an interlaced representation are represented in trellis form.

FIG. 7 is a trellis representing the operation of a transformation circuit which performs a digital signal analysis according to two dyadic breakdown levels, in one dimension.

The signal to be transformed has here seventeen samples. It must be noted that each signal sample to be transformed may be a coefficient or may be a sequence of coefficients. According to an example which will be more particularly considered subsequently, each sample is a line of a digital image. The filtering carried out by trellis is then a vertical filtering of the image. As a variant, in an equivalent manner, the samples are the columns of the image and the filtering is a horizontal filtering of the image.

The transformation circuit has two associated filters $H_0$ and $H_1$, respectively low-pass and high-pass. The filters chosen are 5/3 filters, which can be represented by their coefficients:

$$H_0 = [-1\ 2\ 6\ 2\ -1]/8$$

$$H_1 = [-1\ 2\ -1]/2$$

According to the so-called "lifting" method of Sweldens, the low-frequency filter $H_0$ can be expressed as a function of the high-frequency filter $H_1$, according to a relationship of the type:

$$H_0 = [0\ 0\ 1\ 0\ 0] + \alpha \cdot [1\ 0\ 1] \cdot H_1$$

where $\alpha$ is a multiplying coefficient, equal to 0.25 for a 5/3 filter, and "*" represents the convolution operation.

Consequently, the low-frequency samples are calculated from the high-frequency samples.

Subsequently, the following notations are used:

$x_0, x_1, x_2, \ldots, x_{2i}, x_{2i+1}, \ldots$ the samples of the signal to be transformed, where i is an integer.

$y_0, y_1, y_2, \ldots, y_{2i}, y_{2i+1}, \ldots$ the first level samples obtained by transformation. The samples with even indices are here the first-level low-frequency samples, and the samples with odd indices are the first-level high-frequency samples.

$y^1_0, y^1_2, \ldots, y^1_{2i}, y^1_{2i+2}, \ldots$ the second-level samples obtained by transformation. The samples with an index which is a multiple of four are the second-level low-frequency samples, while the other samples are the second-level high-frequency samples.

The calculations performed in the transformation circuit are in-place calculations, that is to say a calculated sample, of given rank, is stored in place of another sample of identical rank which was used for its calculation.

Moreover, the samples of the signal to be transformed are processed in an ordered manner, in increasing rank.

The first line L1 of the trellis has the signal samples $x_0$ to $x_{16}$. These samples are stored in the buffer memory 103 as they are used in the filtering.

The second trellis line L2 has the first-level high-frequency samples $\{y_{2i+1}\}$. The first-level high-frequency sample $y_{2i+1}$ is obtained by the formula:

$$y_{2i+1} = x_{2i+1} - 0.5 \cdot (x_{2i} + x_{2i+2}).$$

After it has been calculated, this sample is stored in the buffer memory 103, in place of the sample of identical rank in the original signal $x_{2i+1}$.

The third trellis line L3 has the first-level low-frequency samples $\{y_{2i}\}$. The first-level low-frequency sample $y_{2i}$ is obtained by the formula:

$$y_{2i} = x_{2i} + 0.25 \cdot (y_{2i-1} + y_{2i+1}).$$

After it has been calculated, this sample is stored in the buffer memory 103, in place of the sample $x_{2i}$ of identical rank in the original signal.

The fourth line L4 has the second-level high-frequency samples $\{y^1_{2i}\}$. The second-level high-frequency sample $y^1_{2i}$ is obtained by the formula:

$$y^1_{2i} = y_{2i} - 0.5 \cdot (y_{2i-2} + y_{2i+2})$$

After it has been calculated, this sample is stored in the buffer memory 103, in place of the first-level low-frequency sample $y_{2i}$ of identical rank.

The fifth line L5 has the second-level low-frequency samples $\{y^1_{2i+2}\}$. The second-level low-frequency sample $y^1_{2i+2}$ is obtained by the formula:

$$y^1_{2i+2} = y_{2i+2} + 0.25 \cdot (y^1_{2i} + y^1_{2i+4})$$

After it has been calculated, this sample is stored in the buffer memory 103, in place of the first-level low-frequency sample $y_{2i+2}$ of identical rank.

The result of the transformation, here a two-level dyadic breakdown, of the original signal $\{x_0, \ldots, x_{16}\}$ by the 5/3 filters, is an interlaced signal of the form: $\{ \ldots y^1_{2i}, y_{2i+1}, y^1_{2i+2}, y_{2i+3}, y^1_{2i+4}, \ldots \}$, that is to say having a succession of second-level high-frequency samples, first-level high-frequency samples, second-level low-frequency samples, first-level high-frequency samples, and so on.

Of course, it is possible to carry out analogous operations on a different number of samples, over a different number of breakdown levels, or to use other filters over one or more breakdown levels, or to effect a breakdown other than dyadic.

According to the invention, the original samples of the digital signal are transformed into output samples, any output sample being calculated by a function of original samples, and/or of intermediate samples, and/or of output samples. Each function is broken down into elementary operations, and the elementary operations of all the functions are ordered so that the number of samples necessary simultaneously is a minimum.

In other words, according to the invention, in order to minimise the buffer memory occupancy of the data being processed, each of the operations making it possible to calculate a sample is first of all broken down into elementary operations. Next, the elementary operations are ordered.

As depicted in FIG. 15, an operation of the type: $y_{2i+1} = a \cdot x_{2i+1} + b \cdot (x_{2i} + x_{2i+2})$ is broken down into two elementary operations, each involving only two samples:

$p_{2i+1} = a \cdot x_{2i+1} + b \cdot x_{2i}$, where $p_{2i+1}$ represents a partial result, and $y_{2i+1} = p_{2i+1} + b \cdot x_{2i+2}$.

Subsequently, the first of these operations will be referred to as a left elementary operation and the second of these operations will be referred to as a right elementary operation.

This breakdown of a linear combination into two elementary operations is general and applies to each level of the trellis, whatever the values of the factors a and b.

Thus, with the example of FIG. 7, the calculation of the first-level high-frequency sample $y_{2i+1}$ obtained by the formula: $y_{2i+1} = x_{2i+1} - 0.5 \cdot (x_{2i} + x_{2i+2})$ is broken down into two elementary operations, each involving only two samples:

$p_{2i+1} = x_{2i+1} - 0.5 \cdot x_{2i}$, where $p_{2i+1}$ represents a partial result, and $y_{2i+1} = p_{2i+1} - 0.5 \cdot x_{2i+2}$.

Likewise, the calculation of the first-level low-frequency sample $y_{2i}$ obtained by the formula $y_{2i} = x_{2i} + 0.25 \cdot (y_{2i-1} + y_{2i+1})$ is broken down into two elementary operations, each involving only two samples:

$p_{2i} = x_{2i} + 0.25 \cdot y_{2i-1}$, where $p_{2i+1}$ represents a partial result, and $y_{2i} = p_{2i} + 0.25 \cdot y_{2i+1}$.

The breakdown of the formulae for the second level is analogous.

Each elementary operation is represented in FIG. 7 by two adjacent and converging strokes T1 and T2 between one line and the next line.

After this breakdown, the elementary operations are ordered. Thus, the numeral situated between two strokes T1 and T2 represents the rank of the elementary operation represented by these two lines.

In order to reduce the number of calculations carried out for each elementary operation, the formulae of the elementary operations, in the case of linear combinations of samples, can be transformed so that the multiplying factor b is equal to one. Thus, with the factor b equal to one, the relationship $p_{2i+1} = a \cdot x_{2i+1} + b \cdot x_{2i}$ requires one multiplication and one addition, and the relationship $y_{2i+1} = p_{2i+1} + b \cdot x_{2i+2}$ requires one addition only. In total, when the factor b is equal to one, these two elementary operations require one multiplication less than when b is different from one.

FIG. 8 summarizes, for each elementary operation in the trellis of FIG. 7, the samples to be entered into buffer memory, the samples present in buffer memory, and the samples which come out of the buffer memory. In order to simplify the notations, the samples are represented here only by their index.

The elementary operation number 1 requires the samples $x_0$ and $x_1$, the elementary operation number 2 requires in addition the sample $x_2$, and so on. After the operation number 5, the sample y, is no longer used, and it can therefore be taken out of the buffer memory. As soon as a sample is no longer of use for subsequent operations, it is taken out of the buffer memory.

From the elementary operation number 9 and up to the elementary operation number 44, that is to say under steady state conditions, the number of samples necessary for carrying out the elementary operations by in-place calculations is five. On the edges (before the operation number 9 and after the operation number 44), the number of samples necessary is lower.

By virtue of the invention, the number of samples necessary simultaneously in buffer memory is limited to a maximum number, equal to twice the number of breakdown levels plus one, for a type 5/3 analysis filter, here five for a type 5/3 analysis filter with two breakdown levels.

FIG. 9 is a trellis representing the operation of the inverse transformation circuit, or synthesis circuit, corresponding to the trellis of FIG. 7. The samples to be filtered are here the interlaced samples obtained after analysis filtering of a digital image. These samples have possibly been modified by another processing between the analysis and the synthesis.

The first line L10 has the second-level high-frequency samples $y^1_{2i}$ interlaced with the second-level low-frequency samples $y^1_{2i+2}$.

The second line L11 has half the first-level low-frequency samples $y_{2i+2}$. The first-level low-frequency sample $y_{2i+2}$ is obtained by the formula:

$$y_{2i+2} = y^1_{2i+2} + 0.5 \cdot (y^1_{2i} + y^1_{2i+4}).$$

After it has been calculated, the sample $y_{2i+2}$ is stored in the buffer memory 103 in place of the sample $y^1_{2i+2}$.

The third line L12 has the first-level high-frequency samples $y_{2i+1}$. The third line L12 also has the other half of the first-level low-frequency samples $y_{2i}$ which are obtained by the formula:

$$y_{2i} = y^1_{2i} - 0.25 \cdot (y_{2i-2} + y_{2i+2})$$

After it has been calculated, the sample $y_{2i}$ is stored in the buffer memory 103 in place of the sample $y^1_{2i}$.

The fourth line L13 has the even rank samples $x_0$, $x_2$, $x_{2i}$, . . . , $x_{16}$ of the reconstructed signal. The even rank sample $x_{2i}$ is obtained by the formula:

$$x_{2i} = y_{2i} + 0.5 \cdot (y_{2i-1} + y_{2i+1})$$

After it has been calculated, the sample $x_{2i}$ is stored in the buffer memory 103 in place of the sample $y_{2i}$.

The fifth line L14 has the odd rank samples $x_1$, . . . , $x_{2i+1}$, . . . , $x_{15}$ of the reconstructed signal. The odd rank sample $x_{2i+1}$ is obtained by the formula:

$$x_{2i+1} = y_{2i+1} - 0.25 \cdot (x_{2i+2} + x_{2i}).$$

After it has been calculated, the sample $x_{2i+1}$ is stored in the buffer memory 103 in place of the sample $y_{2i+1}$.

As previously, each operation is broken down into two respectively left and right elementary operations, and the elementary operations are ordered, so as to minimize the buffer memory occupancy of the data being processed.

The output samples are formed in an ordered manner, in increasing rank, which makes it possible to use the output signal directly, with no additional operation for re-ordering the samples.

FIG. 10 summarizes, for each elementary operation in the trellis of FIG. 9, the samples to be entered into buffer memory, the samples present in buffer memory, and the samples which come out of the buffer memory. In order to simplify the notations, the samples are represented here only by their index.

The elementary operation number 1 requires the samples of rank zero and rank two $y^1_0$ and $y^1_2$, the elementary operation number 2 requires in addition the sample $y^1_4$, and so on. After the operation number 8, the sample of rank 0 is no longer used, and it can therefore be taken out of the buffer memory. As soon as a sample is no longer of use for subsequent operations, it is taken out of the buffer memory.

From the elementary operation number 5 and up to the elementary operation number 40, that is to say under steady state conditions, the number of samples necessary for carrying out the elementary operations by in-place calculations is five. On the edges (before the operation number 5 and after the operation number 40), the number of samples necessary is lower.

By virtue of the invention, the number of samples necessary simultaneously in buffer memory is limited to a maximum number, equal to twice the number of breakdown levels plus one, for a type 5/3 synthesis filter, here five for a type 5/3 synthesis filter with two breakdown levels.

FIG. 11 is a trellis representing the operation of another transformation circuit which performs a digital signal analysis according to two dyadic breakdown levels, in one dimension. The transformation circuit has two associated filters $H_0$ and $H_1$, respectively low-pass and high-pass.

The input samples are processed in an ordered manner, in increasing rank.

According to a first embodiment, the filters chosen are 9/7 filters, for example those explained in the article "Ten lectures on wavelets", by Ingrid DAUBECHIES, CBMS-NSF regional conference series in applied mathematics Vol.61 SIAM, Journal of Mathematics Anal. Philadelphia Pa. 1992.

By performing calculations analogous to those presented previously, the following relationships between the samples in the trellis are obtained.

The first line L20 of the trellis has the samples to be filtered $x_0$ to $x_N$. These samples are stored in the buffer memory 103 as they are used for the filtering.

The second line L21 of the trellis is a first stage for the first breakdown level and has intermediate samples $t_{2i+1}$ obtained by the formula: $t_{2i+1} = x_{2i+1} - 1.586134 \cdot (x_{2i} + x_{2i+2})$.

After it has been calculated, the sample $t_{2i+1}$ is stored in buffer memory, in place of the sample of identical rank in the original signal.

The third line L22 of the trellis is a second stage for the first breakdown level and has intermediate samples $v_{2i}$ obtained by the formula: $v_{2i} = x_{2i} - 0.052980 \cdot (t_{2i+1} + t_{2i-1})$.

After it has been calculated, the sample $v_{2i}$ is stored in buffer memory, in place of the sample of identical rank in the original signal.

The fourth line L23 of the trellis is a third stage for the first breakdown level and has the first-level high-frequency samples $y_{2i+1}$ obtained by the formula: $y_{2i+1} = t_{2i+1} + 0.882911 \cdot (v_{2i} + v_{2i+2})$.

After it has been calculated, the sample $y_{2i+1}$ is stored in buffer memory, in place of the intermediate sample of identical rank.

The fifth line L24 of the trellis is a fourth stage for the first breakdown level and has the first-level low-frequency samples $y_{2i}$ obtained by the formula: $y_{2i} = v_{2i} + 0.443507 \cdot (y_{2i+1} + y_{2i-1})$.

After it has been calculated, the sample $y_{2i}$ is stored in buffer memory, in place of the intermediate sample of identical rank.

The samples $y_{2i}$ and $y_{2i+1}$ are next normalized. In order to simplify the notations, the normalized samples are referenced $y_{2i}$ and $y_{2i+1}$. The normalization formulae are:

$$y_{2i} = y_{2i}/K_0$$

$$y_{2i+1} = y_{2i+1} \cdot K_1$$

where $K_0$ and $K_1$ are normalization factors equal to 0.869865 for these 9/7 filters.

After they have been calculated, these samples are stored in the buffer memory 103 in place of the initial samples $y_{2i}$ and $y_{2i+1}$.

The samples used for the second breakdown level are now the normalized samples.

The sixth line L25 of the trellis is a first stage for the second breakdown level and has intermediate samples $t^1_{2i}$ obtained by the formula: $t^1_{2i}=y_{2i}-1.586134\cdot(y_{2i-2}+y_{2i+2})$.

After it has been calculated, the sample $t^1_{2i}$ is stored in buffer memory, in place of the sample $y_{2i}$ of identical rank.

The seventh line L26 of the trellis is a second stage for the second breakdown level and has intermediate samples $v^1_{2i+2}$ obtained by the formula: $v^1_{2i+2}=y_{2i+2}-0.052980\cdot(t^1_{2i}+t^1_{2i+4})$.

After it has been calculated, the sample $v^1_{2i+2}$ is stored in buffer memory, in place of the sample $y_{2i+2}$ of identical rank.

The eighth line L27 of the trellis is a third stage for the second breakdown level and has the second-level high-frequency samples $y^1_{2i}$ obtained by the formula: $y^1_{2i}=t^1_{2i}+0.882911\cdot(v^1_{2i-2}+v^1_{2i+2})$.

After it has been calculated, the sample $y^1_{2i}$ is stored in buffer memory, in place of the intermediate sample of identical rank.

The ninth line L28 of the trellis is a fourth stage for the second breakdown level and has the second-level low-frequency samples $y^1_{2i+2}$ obtained by the formula: $y^1_{2i+2}=v^1_{2i+2}+0.443507\cdot(y^1_{2i}+y^1_{2i+4})$.

After it has been calculated, the sample $y^1_{2i+2}$ is stored in buffer memory, in place of the intermediate sample of identical rank.

The samples $y^1_{2i}$ and $y^1_{2i+2}$ are next normalized. In order to simplify the notations, the normalized samples are referenced $y^1_{2i}$ and $y^1_{2i+2}$. The normalization formulae are:

$$y^1_{2i}=y^1_{2i}\cdot K_1$$

$$y^1_{2i+2}=y^1_{2i+2}/K_0$$

where $K_0$ and $K_1$ are equal to 0.869865.

After they have been calculated, these samples are stored in the buffer memory 103 in place of the initial samples $y^1_{2i}$ and $y^1_{2i+2}$.

The result of the transformation, here a two-level dyadic breakdown, of the original signal $\{x_0, \ldots x_{16}\}$ by the 9/7 filters, is an interlaced signal of the form: $\{\ldots, y^1_{2i-2}, y_{2i-1}, y^1_{2i}, y_{2i+1}, y^1_{2i+2}, \ldots\}$, that is to say having a succession of second-level low-frequency samples, first-level high-frequency samples, second-level high-frequency samples, first-level high-frequency samples, and so on.

As previously, each operation is broken down into two respectively left and right elementary operations, and the elementary operations are ordered so as to minimize the buffer memory occupancy of the data being processed.

Compared with the 5/3 filter, the differences here are that each breakdown level has a number of stages with intermediate samples, and that it is necessary to apply the normalization factors $K_0$ and $K_1$.

According to a second embodiment, the filters chosen for the trellis of FIG. 11 are the same 9/7 filters, which are formulated in different manners:

$$t_{2i+1}=-0.6304671\cdot x_{2i+1}+(x_{2i}+x_{2i+2})$$

$$v_{2i}=11.899984\cdot x_{2i}+(t_{2i+1}+t_{2i-1})$$

$$y_{2i+1}=-21.37797\cdot t_{2i+1}+(v_{2i}+v_{2i+2})$$

$$y_{2i}=2.55379718\cdot v_{2i}+(y_{2i+1}+y_{2i-1})$$

$$y_{2i}=y_{2i}/K_0$$

$$y_{2i+1}=y_{2i+1}\cdot K_1$$

where $K_0$ and $K_1$ are normalization factors respectively equal to 26.435129 and 0.064539 for these 9/7 filters.

$$t^1_{2i}=-0.6304671\cdot y_{2i}+(y_{2i-2}+y_{2i+2})$$

$$v^1_{2i+2}=11.899984\cdot y_{2i+2}+(t^1_{2i}+t^1_{2i+4})$$

$$y^1_{2i}=-21.37797\cdot t^1_{2i}+(v^1_{2i-2}+v^1_{2i+2})$$

$$y^1_{2i+2}=2.55379718\cdot v^1_{2i+2}+(y^1_{2i}+y^1_{2i+4})$$

$$y^1_{2i}=y^1_{2i}\cdot K_1$$

$$y^1_{2i+2}=y^1_{2i+2}/K_0$$

where $K_0$ and $K_1$ are respectively equal to 26.435129 and 0.064539.

The implementation of this second embodiment is identical to that of the first. In particular, each operation is broken down into two respectively left and right elementary operations, and the elementary operations are ordered so as to minimize the buffer memory occupancy of the data being processed.

FIG. 12 summarizes, for each elementary operation in the trellis of FIG. 11, the samples to be entered into buffer memory, the samples present in buffer memory, and the samples which come out of the buffer memory. In order to simplify the notations, the samples are represented here only by their index.

The elementary operation number 1 requires the samples $x_0$ and $x_1$, the elementary operation number 2 requires in addition the sample $x_2$, and so on. After the operation number 14, the sample of rank 1 is no longer used, and it can therefore be taken out of the buffer memory. As soon as a sample is no longer of use for subsequent operations, it is taken out of the buffer memory.

From the elementary operation number 41 and up to the elementary operation number 75, that is to say under steady state conditions, the number of samples necessary for carrying out the elementary operations by in-place calculations is nine. On the edges (before the operation number 41 and after the operation number 75), the number of samples necessary is lower.

By virtue of the invention, the number of samples necessary simultaneously in buffer memory is limited to a maximum number, equal to four times the number of breakdown levels plus one, for a type 9/7 analysis filter, here nine for a type 9/7 analysis filter with two breakdown levels.

FIG. 13 is a trellis representing the operation of the inverse transformation circuit, or synthesis circuit, corresponding to the trellis of FIG. 11. The formulae presented below correspond to those of the first embodiment of FIG. 11, and can be used to synthesize a signal analyzed by the first or the second embodiment, since they give the same results. Of course, it is possible to use synthesis formulae corresponding to the second embodiment of FIG. 11, which would give identical results.

The first line L30 of the trellis has the second-level low-frequency samples $y^1_{2i+2}$ and the second-level high-frequency samples $y^1_{2i}$ obtained by analysis filtering (FIG. 11). These samples are first of all normalized. In order to simplify the notations, the normalized samples are referenced $y^1_{2i}$ and $y^1_{2i+2}$. The normalization formulae are:

$$y^1_{2i}=y^1_{2i}/K_1$$

$$y^1_{2i+2}=y^1_{2i+2}\cdot K_0$$

where $K_0$ and $K_1$ are equal to 0.869865.

After they have been calculated, these samples are stored in the buffer memory 103 in place of the initial samples $y^1_{2i}$ and $y^1_{2i+2}$.

The second line L31 of the trellis is a first stage for the second breakdown level and has intermediate samples $v^1_{2i+2}$ obtained by the formula: $v^1_{2i+2} = y^1_{2i+2} - 0.443507 \cdot (y^1_{2i} + y^1_{2i+4})$.

After it has been calculated, the sample $v^1_{2i+2}$ is stored in buffer memory, in place of the sample $y^1_{2i+2}$ of identical rank.

The third line L32 of the trellis is a second stage for the second breakdown level and has intermediate samples $t^1_{2i}$ obtained by the formula: $t^1_{2i} = y^1_{2i} - 0.882911 \cdot (v^1_{2i-2} + v^1_{2i+2})$.

After it has been calculated, the sample $t^1_{2i}$ is stored in buffer memory, in place of the sample $y^1_{2i}$ of identical rank.

The fourth line L33 of the trellis is a third stage for the second breakdown level and has half the first-level low-frequency samples $y_{2i+2}$ obtained by the formula: $y_{2i+2} = v^1_{2i+2} + 0.052980 \cdot (t^1_{2i} + t^1_{2i+4})$.

After it has been calculated, the sample $y_{2i+2}$ is stored in buffer memory, in place of the intermediate sample of identical rank.

The fifth line L34 of the trellis is a fourth stage for the second breakdown level and has the other half of the first-level low-frequency samples $y_{2i}$ obtained by the formula: $y_{2i} = t^1_{2i} + 1.586134 \cdot (y_{2i+2} + y_{2i-2})$.

After it has been calculated, the sample $y_{2i}$ is stored in buffer memory, in place of the intermediate sample of identical rank.

The fifth line L34 of the trellis also has the first-level high-frequency samples $y_{2i+1}$ interlaced with the low-frequency samples of the same level.

The samples $y_{2i}$ and $y_{2i+1}$ are next normalized. In order to simplify the notations, the normalized samples are referenced $y_{2i}$ and $y_{2i+1}$. The normalization formulae are:

$$y_{2i} = y_{2i} \cdot K_0$$

$$y_{2i+1} = y_{2i+1} / K_1$$

where $K_0$ and $K_1$ are equal to 0.869865.

After they have been calculated, these samples are stored in the buffer memory 103 in place of the initial samples $y_{2i}$ and $y_{2i+1}$.

The samples used for the first breakdown level are now the normalized samples.

The sixth line L35 of the trellis is a first stage for the first breakdown level and has samples $v_{2i}$ obtained by the formula: $v_{2i} = y_{2i} - 0.443507 \cdot (y_{2i-1} + y_{2i+1})$.

After it has been calculated, the sample $v_{2i}$ is stored in buffer memory, in place of the sample $y_{2i}$ of identical rank.

The seventh line L36 of the trellis is a second stage for the first breakdown level and has samples $t_{2i+1}$ obtained by the formula: $t_{2i+1} = y_{2i+1} - 0.882911 \cdot (v_{2i} + v_{2i+2})$.

After it has been calculated, the sample $t_{2i+1}$ is stored in buffer memory, in place of the sample $y_{2i+1}$ of identical rank.

The eighth line L37 of the trellis is a third stage for the first breakdown level and has samples $x_{2i}$ of the reconstructed signal obtained by the formula: $x_{2i} = v_{2i} + 0.052980 \cdot (t_{2i+1} + t_{2i-1})$.

After it has been calculated, the sample $x_{2i}$ is stored in buffer memory, in place of the intermediate sample of identical rank.

The ninth line L38 of the trellis is a fourth stage for the first breakdown level and has samples $x_{2i+1}$ of the reconstructed signal obtained by the formula: $x_{2i+1} = t_{2i+1} + 1.586134 \cdot (x_{2i} + x_{2i+2})$.

After it has been calculated, the sample $x_{2i+1}$ is stored in buffer memory, in place of the intermediate sample of identical rank.

As previously, each operation is broken down into two respectively left and right elementary operations, and the elementary operations are ordered, so as to minimize the buffer memory occupancy of the data being processed.

The output samples are formed in an ordered manner, in increasing rank.

Figure 14:
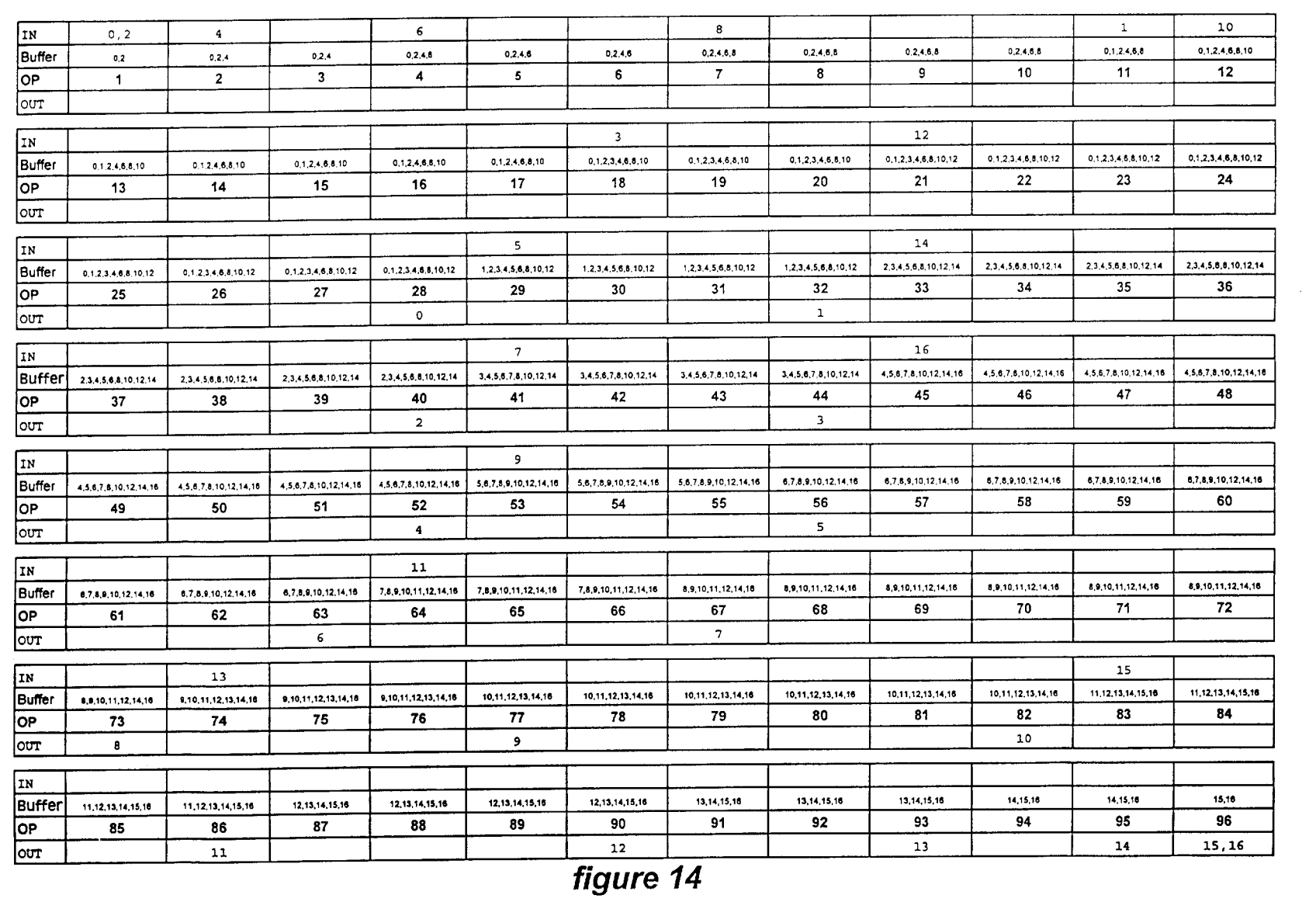

FIG. 14 summarizes, for each elementary operation in the trellis of FIG. 13, the samples to be entered into buffer memory, the samples present in buffer memory, and the samples which come out of the buffer memory. In order to simplify the notations, the samples are represented here only by their index.

The elementary operation number 1 requires the samples $y^1_0$ and $y^1_2$, the elementary operation number 2 requires in addition the sample $x_2$, and so on. After the operation number 28, the sample of rank zero is no longer used, and it can therefore be taken out of the buffer memory. As soon as a sample is no longer of use for subsequent operations, it is taken out of the buffer memory.

From the elementary operation number 21 and up to the elementary operation number 55, that is to say under steady state conditions, the number of samples necessary for carrying out the elementary operations by in-place calculations is nine. On the edges (before the operation number 21 and after the operation number 55), the number of samples necessary is lower.

By virtue of the invention, the number of samples necessary simultaneously in buffer memory is limited to a maximum number equal to four times the number of breakdown levels plus one, for a type 9/7 synthesis filter, here nine for a type 9/7 synthesis filter with two breakdown levels.

FIG. 16 depicts a method of digital signal transformation, here of vertical analysis filtering of a digital image. The signal samples to be filtered are here lines $x_0$ to $x_N$ of the digital image. The filtering method according to the invention is implemented in the device depicted in FIG. 3, described previously. The method is depicted in the form of an algorithm having steps E1 to E7 which are for example stored on the hard disk 108.

The step E1 is an initialization at which the samples $x_0$ to $x_N$ to be filtered, the number L of breakdown levels and the number E of stages for a level are considered. As previously depicted, the number N is even and by way of example is equal to 16, but can take any value. The number of stages depends on the type of filter used. In the case of a 5/3 filter (FIG. 7), the number E of stages is two, while for a 9/7 filter (FIG. 11), the number of stages is four. The sample $x_0$, here the line of rank zero, is entered into the buffer memory 103 (FIG. 3).

The following step E2 is the calculation of the following parameters:

the number L of breakdown levels is decreased by one unit, for practical calculation reasons, the number OP of elementary operations to be performed is calculated. The number OP depends on the number of signal samples to be filtered, the number of breakdown levels and the number of stages per level. The number OP is given by the formula:

$$OP = 2 \cdot E \cdot N \cdot (1 - 2^{-(L+1)})$$

the number E of stages is next decreased by one unit, for practical calculation reasons, a parameter n is initialised to the value one. The parameter n is the current sample rank.

a current elementary operation indicator ind is initialized to the value LEFT. The current indicator ind can take two values LEFT or RIGHT in order to represent a left elementary operation or a right elementary operation, as depicted in FIG. 15.

a current operation counter op is initialized to the value one to designate the first elementary operation.

The following steps E3 to E6 are repeated for the set of elementary operations necessary for the filtering.

The step E4 is the filtering proper which is carried out for a series of elementary operations. This step is detailed subsequently.

At the following step E5, the parameter n is incremented by one unit in order to consider the next sample.

The step E6 allows looping of the steps E3 to E6 while there remain elementary operations to be performed.

The step E6 is followed by the step E7 at which the sample of rank N is normalized and then taken out of the buffer memory 103 (FIG. 3). The normalization consists of multiplying the sample of rank N by the normalization factor $1/K_0$ since N is even. The value of the factor $K_0$ depends on the type of filter. For example, the factor $K_0$ is equal to one for the 5/3 filter, equal to 0.869865 for the first 9/7 filter embodiment described above, and equal to 26.435129 for the second 9/7 filter embodiment described previously.

The step E4 is now detailed with reference to FIG. 17. This step is depicted in the form of sub-steps E41 to E66.

The step E41 is an initialization at which parameters are initialized.

A parameter I is set to the value zero. The parameter I represents the current breakdown level. A parameter p is set to the value 1. The parameter p represents the step between two samples to be filtered.

A parameter go is set to the value one. The parameter go is used as an output test for the general loop which will be explained subsequently.

The step E41 is followed by the step E42 which is a test to determine if the current value of the sample rank n is between 0 and N. This is because, in order to process the edges of the signal, the parameter n can take values which are negative or greater than N. In this case, the processing is specific.

When the reply is positive, the step E42 is followed by the step E43 at which the sample $x_n$ is entered into the buffer memory 103 (FIG. 3).

When the reply is negative at the step E42, no sample is entered into memory and this step is followed by the step E44. The step E43 is also followed by the step E44. The step E44 is the start of the general loop during which a series of elementary operations is performed. This series is a succession of descending operations in a trellis, for example the operations having the numbers 45, 46, 47, 48, 49, 50, 51 and 52 in FIG. 11. Each elementary operation of a given series uses one and the same set of samples of the signal to be filtered, and the change from one series to the next is marked by the use of a different set of samples.

The following step E45 is the start of a stage loop, the purpose of which is to run through all the stages of a level for a given series. This loop is controlled by a parameter e which varies between zero and E in steps of one.

At the following step E46, a parameter k is calculated by the formula:

$$k = n - e \cdot p - (2^I - 1) \cdot (E+1)$$

The following step E47 is a test to determine if the parameter e is equal to zero and if the parameter I is strictly greater than zero. If these two conditions are simultaneously verified, then the step E47 is followed by the step E48 at which a check is made as to whether the quotient k/p is equal to one modulo two. This test is used to determine whether the next elementary operation to be performed is of left or right type.

If the reply at the step E48 is positive, then this step is followed by the step E49 at which the parameter ind is set to the value LEFT.

If the reply at the step E48 is negative, then this step is followed by the step E50 at which the parameter ind is set to the value RIGHT.

If the reply at the step E47 is negative, then this step is followed by the step E51.

The steps E49 and E50 are also followed by the step E51, which is a test on the value of the parameter ind. If the parameter ind is equal to LEFT, then the step E51 is followed by the step E52 which is an analysis filtering corresponding to a left elementary operation for which a working parameter $m_2$ is set to the value k. The parameter $m_2$ represents a sample rank. The step E52 is described in detail subsequently.

If the parameter ind is equal to RIGHT, then the step E51 is followed by the step E53 which is an analysis filtering corresponding to a right elementary operation for which a working parameter $m_1$ is set to the value (k−p). The parameter $m_1$ represents a sample rank. The step E53 is described in detail subsequently.

The step E52 is followed by the step E54 which is a test to check if the parameter e is equal to E. If the reply is positive, then the step E54 is followed by the step E55 which is a test to check if the difference (k−p) is greater than or equal to zero and less than or equal to N.

If the reply is positive, then the step E55 is followed by the step E56 at which the sample of rank (k−p) is taken out of the buffer memory. The step E56 is followed by the step E58 which is the end of the stage loop. If the reply at the step E55 is negative, then this step is followed by the step E58.

Depending on the value of the parameter e, the step E58 is followed by the step E45, in order to run through the loop for the next value of the parameter e, or is followed by the step E59 when all values of the parameter e have been used.

The step E53 is followed by the step E57 which is a test to determine if the parameter e is equal to E and if the parameter I is equal to L. If the reply is positive, this means that the processing has reached the last stage of the last breakdown level, and the step E57 is followed by the step E55. If the reply is negative, then the step E57 is followed by the step E58.

The step E59 is a test to determine if the parameter ind is equal to RIGHT. If the reply is positive, this means that the processing has reached the end of the current breakdown level, and the step E59 is followed by the step E60 at which the parameter I is incremented by one unit, the parameter p is set to the value $2^I$ and the parameter ind is set to the value LEFT.

The step E60 is followed by the step E61 which is a test to determine if the parameter I is strictly greater than L. If the reply is positive, this means that all the breakdown levels have been run through, and the step E61 is followed by the step E62 at which the parameter go is set to zero. The step E62 is followed by the step E66 which is the end of the main loop. If the reply at the step E61 is negative, then the step E61 is followed by the step E66.

If the reply is negative at the step E59, then this step is followed by the step E63 at which the parameter go is set to zero.

The step E63 is followed by the step E64 which is a test to determine if the parameter I is strictly greater than zero. If the reply is positive, this means that the processing is not at the first breakdown level, and this step is followed by the step E66.

If the reply is negative at the step E64, then this step is followed by the step E65 at which the parameter ind is set to the value RIGHT. The step E65 is followed by the step E66.

The step E66 is followed by the step E44 as long as the parameter go is equal to one, and by the step E5 when the parameter go is equal to zero.

The step E53 for analysis filtering according to a right elementary operation is described in detail with reference to FIG. 18. This step has sub-steps E530 to E537.

The step E530 is an initialisation at which the parameter p is set to the value $2^I$.

The following step E531 is a test to check if the current value of the parameter $m_1$ is greater than or equal to zero and if the current value of the sum $(m_1+p)$ is less than or equal to N. If the reply is negative, execution of the step E53 is terminated and the step E531 is followed by the step E57.

If the reply at the step E531 is positive, then this step is followed by the step E532 which is a test to check if the current value of the parameter e is nil. If the reply is positive, this step is followed by the step E533, at which a horizontal filtering of the line of rank $(m_1+p)$ is performed.

The steps E532 and E533 are of use where the samples considered are lines of a digital image.

The step E533 is followed by the step E534, just as, in the event of a negative reply at the step E532, the latter is followed by the step E534.

The step E534 is the analysis filtering proper according to a right elementary operation. The sample $u_{m1}$ of rank $m_1$ is replaced in memory by a sample calculated according to the formula: $A_e \cdot u_{m1} + B_e \cdot u_{m1+p}$, where $u_{m1}$ and $u_{m1+p}$ represent respectively the samples of rank $m_1$ and $m_1+p$, and the coefficients $A_e$ and $B_e$ depend on the filter chosen and the current stage e. The coefficients $A_e$ and $B_e$ may also depend on the current breakdown level.

The following step E535 is a test to determine if the parameter e is equal to E.

If the reply is positive at the step E535, this step is followed by the step E536 which is the normalization of the sample of rank $m_1$. The normalization consists of multiplying the sample of rank $m_1$ by the normalization factor $1/K_0$. The value of the factor $K_0$ depends on the type of filter. For example, the factor $K_0$ is equal to one for the 5/3 filter, equal to 0.869865 for the first 9/7 filter embodiment described above, and equal to 26.435129 for the second 9/7 filter embodiment described previously.

The step E536 is followed by the step E537. Likewise, in the event of a negative reply at the step E535, this step is followed by the step E537.

At the step E537, the parameter op is incremented by one unit. This step is followed by the step E57.

The step E52 for analysis filtering according to a left elementary operation is described in detail with reference to FIG. 19. This step has sub-steps E520 to E529.

The step E520 is an initialization at which the parameter p is set to the value $2^I$.

The following step E521 is a test to check if the current value of the difference $(m_2-p)$ is greater than or equal to zero and if the current value of the parameter $m_2$ is less than or equal to N. If the reply is negative, execution of the step E52 is terminated and the step E521 is followed by the step E54.

If the reply at the step E521 is positive, then this step is followed by the step E522 which is a test to check if the current value of the parameter e is nil. If the reply is positive, this step is followed by the step E523 which is a test to check if the current value of the difference $(m_2-p)$ is nil. If the reply is positive, this step is followed by the step E524 which is a horizontal analysis filtering of the line of rank zero.

If the reply at the step E523 is negative, then this step is followed by the step E525 which is a horizontal analysis filtering of the line of rank $m_2$.

The step E524 is also followed by the step E525.

The steps E523 to E525 are specific for cases where the samples to be filtered are lines of a digital image.

The step E525 is followed by the step E526, just as, in the event of a negative reply at the step E522, the latter is followed by the step E526.

The step E526 is the filtering proper according to a left elementary operation. The sample $u_{m2}$ of rank $m_2$ is replaced in memory by a sample calculated according to the formula: $C_e \cdot u_{m2} + D_e \cdot u_{m2-p}$, where $u_{m2}$ and $u_{m2-p}$ represent respectively the samples of rank $m_2$ and $m_2-p$, and the coefficients $C_e$ and $D_e$ depend on the filter chosen and the current stage e. The coefficients $C_e$ and $D_e$ may also depend on the current breakdown level.

The following step E527 is a test to determine if the parameter e is equal to E. If the reply is positive, this step is followed by the step E528 which is the normalization of the sample of rank $m_2-p$ by the factor $K_1$. The step E528 is followed by the step E529. Likewise, in the event of a negative reply, the step E527 is followed by the step E529.

At the step E529, the parameter op is incremented by one unit.

The step E529 is followed by the step E54.

FIG. 20 depicts a signal filtering method according to the invention. This is a vertical synthesis filtering, corresponding to the analysis filtering of FIG. 16. The signal samples Zn to be filtered are here the interlaced samples obtained after analysis filtering of a digital image. These samples have possibly been modified by another processing between the analysis and the synthesis.

The filtering method according to the invention is implemented in the decoding device depicted in FIG. 2, described previously. The method is depicted in the form of an algorithm having steps E10 to E18.

The calculation parameters having the same meaning as in FIGS. 16 to 19 are assigned the same references.

The step E10 is an initialization at which the samples $z_0$ to $z_N$ to be filtered, the number L of breakdown levels and the number E of stages for a level are considered. The number of stages depends on the type of filter used. In the case of a 5/3 filter (FIG. 9), the number E of stages is two, while for a 9/7 filter (FIG. 13), the number of stages is four.

The following step E11 is the calculation of the following parameters:

the number L of breakdown levels is decreased by one unit, for practical calculation reasons, the number OP of elementary operations to be performed is calculated. The number OP depends on the number of signal samples to be filtered, the number of breakdown levels and the number of stages per level. The number OP is given by the formula:

$$OP = 2 \cdot E \cdot N \cdot (1 - 2^{-(L+1)})$$

the number E of stages per breakdown level is next decreased by one unit, for practical calculation reasons, a parameter n is set to zero. The parameter n is the rank of the current sample.

a current operation counter op is initialized to the value one to designate the first elementary operation.

The following steps E12 to E16 are repeated for the set of elementary operations necessary for the filtering.

At the step E13, the parameter I is set to the value L.

The following step E14 is the filtering proper which is carried out for a series of elementary operations. This step is detailed subsequently.

At the following step E15, the parameter n is incremented by the value $2^{L+1}$ in order to consider a following sample.

The step E16 allows looping of the steps E12 to E16 as long as there remain elementary operations to be performed.

When all the elementary operations have been performed, the step E16 is followed by the step E17 at which a horizontal synthesis filtering of the sample of rank N, here the line of rank N, is performed.

The step E17 is followed by the step E18 at which the sample of rank N is taken out of the buffer memory.

The step E14 is now detailed with reference to FIG. 21. This step is depicted in the form of sub-steps E140 to E166.

The step E140 is an initialization at which a parameter p is set to the value $2^I$. The parameter p represents the step between two samples to be filtered.

The following step E141 is the start of a first stage loop, the purpose of which is to run through all the stages of a level for a given series of elementary operations. This loop is controlled by a parameter e which varies between zero and E in-steps of one.

A series of elementary operations is a succession of descending operations in a trellis, for example the operations having the numbers 33 to 40 in FIG. 13. Each elementary operation of a given series uses one and the same set of samples of the signal to be filtered, and the change from one series to the next is marked by the use of a different set of samples.

The step E141 is followed by the step E142 which is a test to determine if the parameter e is equal to zero and the parameter I is equal to L. If the reply is positive, this means that the elementary operation to be performed is at the start of a series, that is to say at the top of the trellis. The step E142 is then followed by the step E143 which is a test to determine if the parameter n is between zero and N. When the reply is positive at the step E143, this step is followed by the step E144 at which a sample of rank n is entered into the buffer memory 103 (FIG. 3).

In the event of a negative reply at the step E142, this step is followed by the step E145. In the event of a negative reply at the step E143, this step is followed by the step E145. Likewise, the step E144 is followed by the step E145, which is a left type synthesis filtering corresponding to a left elementary operation, and for which a parameter $m_4$ is set to the value n–e·p. The parameter $m_4$ represents a sample rank. This step is described with reference to FIG. 23.

The step E145 is followed by the step E146 which is a test to determine if the parameter e is equal to E and if the parameter I is equal to zero. When the reply is positive, this step is followed by the step E147 at which a parameter k is set to the value: n–(E+1)·p.

The following step E148 is a test to check if the parameter k is between zero and N. If the reply is positive, then this step is followed by the step E149 at which a horizontal synthesis filtering is carried out on the reconstructed sample $x_k$, which is here a digital image line.

The step E149 is specific to cases where the samples to be processed are lines of a digital image.

The step E149 is followed by the step E150 at which the sample $x_k$ is taken out of the buffer memory 103.

In the event of a negative reply at the step E146, this step is followed by the step E151.

In the event of a negative reply at the step E148, this step is followed by the step E151, just as the step E150 is followed by the step E151 which is the end of the first stage loop.

The step E151 is followed by the step E141 as long as all values of the parameter e have not been run through, then the step E151 is followed by the step E152 which is a test to determine if the parameter I is strictly greater than zero.

If the reply is positive, the step E152 is followed by the step E153 at which the parameter I is decremented by one unit, the parameter n is replaced by the value n–(E+1)·p, and the decoding processing is performed recursively with these values of the parameters I and n, that is to say the step E153 branches to the step E140 for these values of the parameters I and n.

In the event of a negative reply at the step E152, this step is followed by the step E154, just as the step E153 is followed by the step E154 which is the start of a second stage loop, the purpose of which is to run through all the stages of a level for a given series of elementary operations. This loop is controlled by the parameter e which varies between zero and E in steps of one.

The step E154 is followed by the step E155 which is a test to determine if the parameter e is equal to zero. If the reply is positive, this means that the elementary operation to be performed is at the start of a breakdown level. The step E155 is then followed by the step E156 which is a test to determine if the sum (n+p) is between zero and N. When the reply is positive at the step E156, this step is followed by the step E157 at which the sample of rank n+p is entered into the buffer memory 103.

In the event of a negative reply at the step E155, this step is followed by the step E158. In the event of a negative reply at the step E156, this step is followed by the step E158. Likewise, the step E157 is followed by the step E158, which is a right type synthesis filtering corresponding to a right elementary operation, and for which a parameter $m_3$ is set to the value (n–e·p). The parameter $m_3$ represents a sample rank. This step is described with reference to FIG. 22.

The step E158 is followed by the step E159 which is a test to determine if the parameter e is equal to E and if the parameter I is equal to zero. When the reply is positive, this step is followed by the step E160 at which the parameter k is set to the value: n–E·p.

The following step E161 is a test to check if the parameter k is between zero and N. If the reply is positive, then this step is followed by the step E162 at which a horizontal synthesis filtering is carried out on the sample of rank k, which is here a digital image line.

The step E162 is followed by the step E163 at which the sample of rank k is taken out of the buffer memory 103.

In the event of a negative reply at the step E159, this step is followed by the step E164.

In the event of a negative reply at the step E161, this step is followed by the step E164, just as the step E163 is followed by the step E164 which is the end of the second stage loop.

When the second stage loop has been run through for all values of the parameter e, the step E164 is followed by the step E165 which is a test to determine if the parameter I is strictly greater than zero.

If the reply is positive, then this step is followed by the step E166 at which the parameter I is decremented by one unit, the parameter n is replaced by the value n–E·p, and the decoding processing is performed recursively with these values of the parameters I and n, that is to say the step E166 branches to the step E140 for these values of the parameters I and n.

In the event of a negative reply at the step E165, this step is followed by the step E15. The step E166 is also followed by the step E15 or by the step E154 if the current processing is that of the step E153.

The step E158 of synthesis filtering according to a right elementary operation is described in detail with reference to FIG. 22. This step has sub-steps E1580 to E1591.

The step E1580 is an initialization at which the parameter p is set to the value $2^I$.

The following step E1581 is a test to check if the current value of the parameter $m_3$ is greater than or equal to zero and if the current value of the sum ($m_3+p$) is less than or equal to N. If the reply is negative, execution of the step E158 is terminated and the step E1581 is followed by the step E159.

If the reply at the step E1581 is positive, then this step is followed by the step E1582 which is a test to check if the current value of the parameter e is nil and if the current value of the parameter I is different from L. If the reply is positive, this step is followed by the step E1583 which is a test to check if the current value of the parameter $m_3$ is nil. If the reply is positive, this step is followed by the step E1584 which is a horizontal synthesis filtering of the line of rank zero.

If the reply at the step E1583 is negative, then this step is followed by the step E1585 which is a horizontal synthesis filtering of the line of rank $m_3$.

The step E1584 is also followed by the step E1585.

The steps E1583 to E1585 are specific for cases where the samples to be filtered are lines of a digital image.

The step E1585 is followed by the step E1586, just as, in the event of a negative reply at the step E1582, the latter is followed by the step E1586.

The step E1586 is the filtering proper according to a right elementary operation. The sample $u_{m3}$ of rank $m_3$ is replaced in memory by a sample calculated according to the formula: $u_{m3}=A1_e \cdot u_{m3}+B1_e \cdot u_{m3+p}$ where $u_3$ and $u_{m3+p}$ represent respectively the samples of rank $m_3$ and $m_3+p$, and the coefficients $A1_e$ and $B1_e$ depend on the filter chosen and the current stage e. The coefficients $A1_e$ and $B1_e$ may also depend on the current breakdown level.

The following step E1587 is a test to determine if the parameter e is equal to zero.

If the reply is positive, this step is followed by the step E1588 which is a test to determine if the parameter $m_3$ is nil.

If the reply is positive at the step E1588, then this step is followed by the step E1589 at which the sample of rank zero is normalized by multiplying by the normalization factor $K_0$.

The step E1589 is followed by the step E1590, just as, in the event of a negative reply at the step E1588, this step is followed by the step E1590, at which the sample of rank $m_3$ is normalized by multiplying by the normalization factor $1/K_1$.

The step E1590 is followed by the step E1591, just as, in the event of a negative reply at the step E1587, the latter is followed by the step E1591.

At the step E1591, the parameter op is incremented by one unit. The step E1591 is followed by the step E159.

The step E145 for synthesis filtering according to a left elementary operation is described in detail with reference to FIG. 23. This step has sub-steps E1450 to E1457.

The step E1450 is an initialization at which the parameter p is set to the value $2^I$.

The following step E1451 is a test to check if the current value of the difference ($m_4-p$) is greater than or equal to zero and if the current value of the parameter $m_4$ is less than or equal to N. If the reply is negative, execution of the step E145 is terminated and the step E1451 is followed by the step E146.

If the reply at the step E1451 is positive, then this step is followed by the step E1452 which is a test to check if the current value of the parameter e is nil and if the current value of the parameter I is different from L. If the reply is positive, this step is followed by the step E1453, at which a horizontal synthesis filtering of the line of rank $m_4$ is performed.

The steps E1452 and E1453 are of use where the samples considered are lines of a digital image.

The step E1453 is followed by the step E1454, just as, in the event of a negative reply at the step E1452, the latter is followed by the step E1454.

The step E1454 is the synthesis filtering proper according to a left elementary operation. The sample $u_{m4}$ of rank $m_4$ is replaced in memory by a sample calculated according to the formula: $u_{m4}=C1_e \cdot u_{m4}+D1_e \cdot u_{m4-p}$, where $um_4$ and $u_{m4-p}$ represent respectively the samples of rank $m_4$ and $m_4-p$, and the coefficients $C1_e$ and $D1_e$ depend on the filter chosen and the current stage e. The coefficients $C1_e$ and $D1_e$ may also depend on the current breakdown level.

The following step E1455 is a test to determine if the current value of the parameter e is nil. If the reply is positive, the step E1455 is followed by the step E1456 at which the sample of rank $m_4$ is normalized by multiplying by the normalization factor $K_0$. The step E1456 is followed by the step E1457. Likewise, in the event of a negative reply at the step E1455, this step is followed by the step E1457.

At the step E1457, the parameter op is incremented by one unit. The step E1457 is followed by the step E146.

FIG. 24 is a trellis representing the operation of a transformation circuit according to two dyadic breakdown levels, in one dimension. The transformation circuit has two associated filters $H_0$ and $H_1$, respectively low-pass and high-pass. The filters chosen are 5/3 filters. By comparison with FIGS. 7 and 9, it is sought here to minimize the memory size used both for coding and decoding, with the dual constraint of entering the samples in an ordered manner and also taking them out in an ordered manner, in increasing rank in both cases. This amounts to putting the analysis and synthesis filters of FIGS. 7 and 9 end to end and combining their operation.

The filtering operations, as well as the elementary operations, are identical to those described previously. The relationships between samples of different lines are identical to those described with reference to FIGS. 7 and 9. The same operations are broken down into the same elementary operations.

However, in order to minimize the memory size used both for coding and decoding, the succession of elementary operations is specific. For example, the elementary analysis operation number 20 is followed by the elementary synthesis operation number 21. Consequently the order of the elementary operations is specific to cases where the analysis and synthesis are combined.

FIG. 25 summarizes, for each elementary operation in the trellis of FIG. 24, the samples to be entered into buffer memory, the samples present in buffer memory, and the samples which come out of the buffer memory. In order to simplify the notations, the samples are represented here only by their index.

The elementary operation number 1 requires the samples $x_0$ and $x_1$, the elementary operation number 2 requires in addition the sample $x_2$, and so on. After the operation number 40, the sample $y_0$ is no longer used, and it can therefore be taken out of the buffer memory. As soon as a sample is no longer of use for subsequent operations, it is taken out of the buffer memory.

At the most thirteen samples are necessary simultaneously in buffer memory (between the elementary operations 33 and 64).

By virtue of the invention, the number of samples necessary simultaneously in buffer memory is limited to a maximum number, here thirteen for a type 5/3 analysis and synthesis filter with two breakdown levels.

FIG. 26 depicts the combined signal analysis and synthesis filtering method. The signal samples to be filtered are here lines $x_0$ to $x_N$ of a digital image. This is a vertical analysis and synthesis filtering. The filtering method according to the invention is implemented in the device depicted in FIG. 3, described previously. The method is depicted in the form of an algorithm having steps E20 to E27 which are for example stored on the hard disk 108.

The calculation parameters having the same meaning as in FIGS. 16 to 19 are assigned the same references.

The step E20 is an initialisation at which the samples $x_0$ to $x_N$ to be filtered, the number L of breakdown levels and the number E of stages for a level are considered. The number of stages depends on the type of filter used. In the case of a 5/3 filter (FIG. 24), the number E of stages is two, while for a 9/7 filter, the number of stages is four. The sample $x_0$, here the line of rank zero, is entered into the buffer memory 103.

The following step E21 is the calculation of the following parameters:

the number L of breakdown levels is decreased by one unit, for practical calculation reasons, the number OP of elementary operations to be performed is calculated. The number OP depends on the number of signal samples to be filtered, the number of breakdown levels and the number of stages per level. The number OP is given by the formula:

$$OP = 4 \cdot E \cdot N \cdot (1 - 2^{-(L+1)})$$

the number E of stages is next decreased by one unit, for practical calculation reasons, a parameter n is set to the value 1. The parameter n represents the current sample rank.

a current elementary operation indicator ind is initialised to the value LEFT. The current indicator ind can take two values LEFT or RIGHT in order to represent a left operation or a right operation, as depicted in FIG. 15.

a current operation counter op is initialised to the value one to designate the first elementary operation.

The following steps E22 to E25 are repeated for the set of elementary operations necessary for the filtering.

The step E23 is the filtering proper which is carried out for a series of elementary operations. This step is detailed subsequently.

At the following step E24, the parameter n is incremented by one unit in order to consider the next sample.

The step E25 allows looping of the steps E22 to E25 as long as there remain elementary operations to be performed.

When all the elementary operations have been performed, the step E25 is followed by the step E26 at which the horizontal synthesis filtering of the line N is performed.

The step E26 is followed by the step E27 at which the sample of rank N is taken out of the buffer memory 103.

The step E23 is now detailed with reference to FIG. 27. This step is depicted in the form of sub-steps E230 to E257.

The step E230 is an initialization at which parameters are initialized.

A parameter I is set to the value zero. The parameter I represents the current breakdown level. A parameter p is set to the value 1. The parameter p represents the step between two samples to be filtered.

A parameter go is set to the value one. The parameter go is used as an output test for the general loop which will be explained subsequently.

The step E230 is followed by the step E231 which is a test to determine if the current value of the sample rank n is between 0 and N. This is because, in order to process the edges of the signal, the parameter n can take values which are negative or greater than N. In this case, the processing is specific.

When the reply is positive, the step E231 is followed by the step E232 at which the sample $x_n$, is entered into the buffer memory 103.

When the reply is negative at the step E231, no sample is entered into memory and this step is followed by the step E233. The step E232 is also followed by the step E233. The step E233 is the start of the general loop during which a series of elementary operations is performed. This series is a succession of operations in a trellis, for example the operations having the numbers 45 to 54 in FIG. 24. Each elementary operation of a given series uses one and the same set of samples of the signal to be filtered, and the change from one series to the next is marked by the use of a different set of samples.

The following step E234 is the start of a stage loop, the purpose of which is to run through all the stages of a level for a given series. This loop is controlled by a parameter e which varies between one and E in steps of one.

At the following step E235 a parameter k is calculated by the formula:

$$k = n - e \cdot p - (2^I - 1) \cdot (E + 1)$$

The following step E236 is a test to determine if the parameter e is equal to zero and if the parameter I is strictly greater than zero. If these two conditions are simultaneously verified, then the step E236 is followed by the step E237 at which a check is made as to whether the quotient k/p is equal to one modulo two. This test serves to determine if the next elementary operation to be performed is of left or right type.

If the reply at the step E237 is positive, then this step is followed by the step E238 at which the parameter ind is set to the value LEFT.

If the reply at the step E237 is negative, then this step is followed by the step E239 at which the parameter ind is set to the value RIGHT.

If the reply at the step E236 is negative, then this step is followed by the step E240.

The steps E238 and E239 are also followed by the step E240, which is a test on the value of the parameter ind. If the parameter ind is equal to LEFT, then the step E240 is followed by the step E241 which is an analysis filtering corresponding to a left elementary operation for which the parameter $m_2$ is set to the value k. The step E241 is identical to the step E52 described previously (FIG. 19).

If the parameter ind is equal to RIGHT, then the step E240 is followed by the step E244 which is an analysis filtering corresponding to a right elementary operation for which the parameter m1 is set to the value k−p. The step E244 is identical to the step E53 described previously (FIG. 18). The step E244 is followed by the step E245.

The step E241 is followed by the step E242 which is a test to check if the parameter e is equal to E and if the parameter I is equal to L. If the reply is positive, then the step E242 is followed by the step E243 which is a stage loop carrying out a right type synthesis filtering for which a parameter $m_5$ is set to the value k−2·p. This step will be described in detail subsequently. The step E243 is followed by the step E247.

The step E245 is a test to check if the parameter e is equal to E and if the parameter I is equal to L. If the reply is positive, the step E245 is followed by the step E246 which is a stage loop carrying out a left type synthesis filtering for which a parameter $m_6$ is set to the value k−p. This step will be described in detail subsequently. The step E246 is followed by the step E247.

The step E247 is a test to check if the parameter I is strictly greater than zero. If the reply is positive, then the step E247 is followed by the step E248 which is an iterative loop which will be described in detail subsequently, and for which the parameter I is set to the value I−1 and a parameter $m_7$ is set to the value k−(E+2)·p.

The step E248 is followed by the step E249. Likewise, in the event of a negative reply at the steps E242, E245 and E247, these steps are followed by the step E249 which is the end of the stage loop. Depending on the value of the parameter e, the step E249 is followed by the step E234, in order to run through the loop for the next value of the parameter e, or is followed by the step E250 when all values of parameter e have been used.

The step E250 is a test to determine if the parameter ind is equal to RIGHT. If the reply is positive, the step E250 is followed by the step E251 at which the parameter I is incremented by one unit, the parameter p is set to the value 21 and the parameter ind is set to the value LEFT.

The step E251 is followed by the step E252 which is a test to determine if the parameter I is strictly greater than L. If the reply is positive, the step E252 is followed by the step E253 at which the parameter go is set to zero. If the reply at the step E252 is negative, then the step E252 is followed by the step E257 which is the end of the main loop.

If the reply is negative at the step E250, then this step is followed by the step E254 at which the parameter go is set to zero.

The step E254 is followed by the step E255 which is a test to determine if the parameter I is strictly greater than zero. If the reply is positive, this step is followed by the step E257.

If the reply is negative at the step E255, then this step is followed by the step E256 at which the parameter ind is set to the value RIGHT. The step E256 is followed by the step E257.

The step E257 is followed by the step E233 as long as the parameter go is equal to one, and by the step E24 when the parameter go is equal to zero.

FIG. 28 depicts the detail of the step E248 in the form of steps E2480 to E2486.

The step E2480 is an initialization at which the parameter p is set to the value $2^I$.

The following step E2481 is a loop for carrying out a left type synthesis filtering identical to the step E246 which will be described subsequently, and for which the parameter $m_6$ is equal to the parameter $m_7$.

The following step E2482 is a test to determine if the parameter I is strictly greater than zero. If the reply is positive, this step is followed by the step E2483 at which the step E248 is called recursively, with the parameter $m_7$ set to $m_7$−(E+1)·p and the parameter I set to I−1.

The step E2483 is followed by the step E2484. Likewise, in the event of a negative reply at the step E2482, this step is followed by the step E2484 which is a loop for carrying out a right type synthesis filtering identical to the step E243 which is going to be described and for which the parameter $m_5$ is set to the current value of the parameter $m_7$.

The step E2484 is followed by the step E2485 which is a test to determine if the parameter I is strictly greater than zero. If the reply is positive, this step is followed by the step E2486 at which the step E248 is called recursively, with the parameter $m_7$ set to $m_7$−E·p and the parameter I set to I−1.

The step E2486 is followed by the step E249. Likewise, in the event of a negative reply at the step E2485, this step is followed by the step E249.

FIG. 29 depicts the detail of the step E243 in the form of steps E2430 to E2438.

The step E2430 is an initialization at which the parameter p is set to the value $2^I$.

The following step E2431 is the start of a stage loop, the purpose of which is to run through all the stages of a level for a given series of elementary operations. This loop is controlled by the parameter e which varies between zero and E in steps of one.

The step E2431 is followed by the step E2432, which is a right type synthesis filtering corresponding to a right elementary operation for which the parameter $m_3$ is set to the value ($m_5$−e·p). This step is described with reference to FIG. 22.

The step E2432 is followed by the step E2433 which is a test to determine if the parameter e is equal to E and if the parameter I is equal to zero. When the reply is positive, this step is followed by the step E2434 at which the parameter k is set to the value: $m_5$−E·p.

The following step E2435 is a test to check if the parameter k is greater than or equal to zero. If the reply is positive, then this step is followed by the step E2436 at which a horizontal synthesis filtering is carried out on the sample $x_k$, which is here a digital image line.

The step E2436 is followed by the step E2437 at which the reconstructed sample $x_k$ is taken out of the buffer memory.

In the event of a negative reply at the step E2433, this step is followed by the step E2438.

In the event of a negative reply at the step E2435, this step is followed by the step E2438, just as the step E2437 is followed by the step E2438 which is the end of the stage loop.

FIG. 30 depicts the detail of the step E246 in the form of steps E2460 to E2468.

The step E2460 is an initialization at which the parameter p is set to the value $2^I$.

The following step E2461 is the start of a stage loop, the purpose of which is to run through all the stages of a level for a given series of elementary operations. This loop is controlled by the parameter e which varies between zero and E in steps of one.

The step E2461 is followed by the step E2462, which is a left type synthesis filtering corresponding to a left elementary operation for which the parameter $m_4$ is set to the value $m_6$−e·p. This step is described with reference to FIG. 23.

The step E2462 is followed by the step E2463 which is a test to determine if the parameter e is equal to E and if the parameter I is equal to zero. When the reply is positive, this step is followed by the step E2464 at which the parameter k is set to the value: $m_6$−(E+1)·p.

The following step E2465 is a test to check if the parameter k is greater than or equal to zero. If the reply is positive, then this step is followed by the step E2466 at which a horizontal synthesis filtering is carried out on the sample $x_k$, which is here a digital image line.

The step E2466 is followed by the step E2467 at which the reconstructed sample $x_k$ is taken out of the buffer memory.

In the event of a negative reply at the step E2463, this step is followed by the step E2468.

In the event of a negative reply at the step E2465, this step is followed by the step E2468, just as the step E2467 is followed by the step E2468 which is the end of the stage loop.

Of course, the present invention is in no way limited to the embodiments described and depicted, but on the contrary includes any variant within the capability of persons skilled in the art.

What is claimed is,:

1. Digital signal transformation method, original samples ($x_{2i}$; $y^1_{2i}$, $y_{2i+1}$) of the digital signal being transformed into output samples ($y^1_{2i}$, $y_{2i+1}$; $x_{2i}$) any output sample being calculated by a function of original samples, and/or of intermediate samples ($t_{2i+1}$, $V_{2i}$, $t^1_{2i}$, $v^1_{2i+1}$), and/or of output samples, wherein:
each function (E526, E534, E1454, E1586) is broken down into elementary operations;
the elementary operations (op) of all the functions are ordered so as to minimize the number of samples that are simultaneously necessary.

2. Transformation method according to claim 1, characterised in that the transformation is a filtering for analysis of the digital signal into interlaced frequency sub-band signals.

3. Transformation method according to claim 1, characterised in that the transformation is a filtering for synthesis of a digital signal analyzed into interlaced frequency sub-band signals, into a synthesized signal.

4. Transformation method according to claim 1, characterised in that the transformation is a filtering for analysis of a digital signal into interlaced frequency sub-band signals, combined with a filtering for synthesis of the signal analyzed into interlaced frequency sub-band signals, into a synthesized signal.

5. Transformation method according to claim 1, characterised in that the elementary operations are functions of samples, at least one multiplying factor of which is equal to one.

6. Transformation method according to claim 1, characterised in that the output sample are multiplied by a normalization factor ($K_0$, $1/K_0$, $K_1$, $1/K_1$).

7. Transformation method according to claim 1, characterised in that the digital signal is an image signal (IM) and in that the original samples are lines of the image.

8. Transformation method according to claim 1, characterised in that the digital signal is an image signal (IM) and in that the original samples are columns of the image.

9. Digital signal transformation device, original samples ($x$; $y^1_{2i}$, $y_{2i+1}$) of the digital signal being transformed into output samples ($y^1_{2i}$, $y_{2i+1}$; $x_i$), the device having means (100) for calculating any output sample by a function of original samples, and/or of intermediate samples ($t_{2i+1}$, $v_{2i}$, $t^1_{2i}$, $v^1_{2i+1}$), and/or of output samples, wherein the calculation means are adapted to:
break down each function into elementary operations (op);
order the elementary operations (op) of all the functions so as to minimize the number of samples that are simultaneously necessary.

10. Transformation device according to claim 9, characterised in that the transformation is a filtering for analysis of the digital signal into interlaced frequency sub-band signals.

11. Transformation device according to claim 9, characterised in that the transformation is a filtering for synthesis of a digital signal analyzed into interlaced frequency sub-band signals, into a synthesized signal.

12. Transformation device according to claim 9, characterised in that the transformation is a filtering for analysis of a digital signal into interlaced frequency sub-band signals, combined with a filtering for synthesis of the signal analyzed into interlaced frequency sub-band signals, into a synthesized signal.

13. Transformation device according to claim 9, characterised in that the elementary operations are functions of samples, at least one multiplying factor of which is equal to one.

14. Transformation device according to claim 9, characterised in that the calculation means are adapted to multiply the output samples by a normalization factor ($K_0$, $1/K_0$, $K_1$, $1/K_1$).

15. Transformation device according to claim 9, characterised in that the digital signal is an image signal (IM) and in that the original samples are lines of the image.

16. Transformation device according to claim 9, characterised in that the digital signal is an image signal (IM) and in that the original samples are columns of the image.

* * * * *

UNITED STATES PATENT AND TRADEMARK OFFICE
CERTIFICATE OF CORRECTION

PATENT NO.     : 6,523,051 B1
DATED          : February 18, 2003
INVENTOR(S)    : Eric Majani et al.

It is certified that error appears in the above-identified patent and that said Letters Patent is hereby corrected as shown below:

Title page,
Item [56], References Cited, U.S. PATENT DOCUMENTS,
"4,709,343 A" reference, "Van Cong" should read -- Van Cang --.

Column 3,
Line 32, "colour" should read -- color --.

Column 9,
Line 30, "$x_{2i}$," should read -- $\ldots,x_{2i}$, --.

Column 21,
Line 29, "$u_3$" should read -- $u_{m3}$ --.

Column 24,
Line 5, "$x_n$," should read -- $x_n$ --.

Column 25,
Line 19, "21" should read -- 2' --.

Column 27,
Line 4, "$x_{2i}$)" should read -- $x_{2i}$), --; and
Line 32, "sample" should read -- samples --.

Signed and Sealed this

Fourth Day of November, 2003

JAMES E. ROGAN
*Director of the United States Patent and Trademark Office*